(12) United States Patent  
Chung et al.

(10) Patent No.: US 9,263,481 B2  
(45) Date of Patent: Feb. 16, 2016

(54) ARRAY SUBSTRATE

(71) Applicant: AU Optronics Corp., Hsin-Chu (TW)

(72) Inventors: Yi-Chen Chung, Hsin-Chu (TW);
Chia-Yu Chen, Hsin-Chu (TW);
Hui-Ling Ku, Hsin-Chu (TW);
Yu-Hung Chen, Hsin-Chu (TW);
Chi-Wei Chou, Hsin-Chu (TW);
Fan-Wei Chang, Hsin-Chu (TW);
Hsueh-Hsing Lu, Hsin-Chu (TW);
Hung-Che Ting, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/598,244

(22) Filed: Jan. 16, 2015

(65) Prior Publication Data

US 2015/0123128 A1    May 7, 2015

Related U.S. Application Data

(62) Division of application No. 13/615,661, filed on Sep. 14, 2012, now Pat. No. 8,969,146.

(30) Foreign Application Priority Data

Nov. 28, 2011 (TW) .............................. 100143536 A
Mar. 19, 2012 (TW) .............................. 101109318 A

(51) Int. Cl.
*H01L 27/14* (2006.01)
*H01L 27/12* (2006.01)
(Continued)

(52) U.S. Cl.
CPC ...... *H01L 27/1288* (2013.01); *H01L 21/28008* (2013.01); *H01L 21/31133* (2013.01);
(Continued)

(58) Field of Classification Search
CPC ............ H01L 27/1225; H01L 27/1222; H01L 27/124; H01L 27/1288; H01L 21/28008; H01L 2227/323; H01L 27/12
USPC ................ 257/59, 72, 88, E29.291, E33.053; 438/34, 158
See application file for complete search history.

(56) References Cited

U.S. PATENT DOCUMENTS 6,242,758 B1   6/2001 Yamazaki
7,981,708 B1   7/2011 Lee
(Continued)

FOREIGN PATENT DOCUMENTS

CN         100379024 C      4/2008
KR      1020080043969 A     5/2008
(Continued)

*Primary Examiner* — Yosef Gebreyesus
(74) *Attorney, Agent, or Firm* — Winston Hsu; Scott Margo

(57) ABSTRACT

The array substrate includes a substrate, a thin film transistor (TFT) and a pixel electrode. The TFT is disposed on the substrate and includes a gate electrode, a gate insulating layer, a patterned semiconductor layer, a patterned etching stop layer, a patterned hard mask layer, a source electrode and a drain electrode. The patterned gate insulating layer is disposed on the gate electrode. The patterned semiconductor layer is disposed on the patterned gate insulating layer. The patterned etching stop layer is disposed on the patterned semiconductor layer. The source and the drain electrodes are disposed on the patterned etching stop layer and the patterned semiconductor layer. The patterned hard mask layer is disposed between the source electrode and the patterned etching stop layer and disposed between the drain electrode and the patterned etching stop layer. The pixel electrode is disposed on the substrate and electrically connected to the TFT.

9 Claims, 26 Drawing Sheets

(51) Int. Cl.
*H01L 21/28* (2006.01)
*H01L 21/311* (2006.01)

(52) U.S. Cl.
CPC .......... *H01L 27/124* (2013.01); *H01L 27/1222* (2013.01); *H01L 27/1225* (2013.01); *H01L 2227/323* (2013.01)

(56) References Cited

U.S. PATENT DOCUMENTS

| | | | |
|---|---|---|---|
| 8,420,553 B2 | 4/2013 | Yamazaki | |
| 8,664,652 B2 | 3/2014 | Yamazaki | |
| 2005/0074930 A1* | 4/2005 | Chen | H01L 29/4908 438/151 |
| 2005/0258427 A1* | 11/2005 | Chan | H01L 29/66787 257/72 |
| 2006/0124930 A1* | 6/2006 | Chen | H01L 29/66765 257/57 |
| 2009/0159880 A1 | 6/2009 | Honda | |
| 2009/0167975 A1 | 7/2009 | Lee | |
| 2010/0051936 A1 | 3/2010 | Hayashi | |
| 2010/0096645 A1 | 4/2010 | Sonoda | |
| 2010/0127266 A1 | 5/2010 | Saito | |
| 2010/0207117 A1 | 8/2010 | Sakata | |
| 2010/0304528 A1 | 12/2010 | Kim | |
| 2011/0084276 A1 | 4/2011 | Kang | |
| 2011/0263079 A1* | 10/2011 | Wang | H01L 21/28506 438/149 |
| 2012/0045904 A1* | 2/2012 | Choi | C23C 16/308 438/786 |
| 2012/0168744 A1 | 7/2012 | Shieh | |
| 2013/0075731 A1 | 3/2013 | Han | |
| 2013/0161625 A1 | 6/2013 | Ku | |

FOREIGN PATENT DOCUMENTS

| | | |
|---|---|---|
| TW | 292433 | 12/1996 |
| TW | 200841475 | 10/2008 |

\* cited by examiner

ARRAY SUBSTRATE

CROSS REFERENCE TO RELATED APPLICATIONS

This application is a division of application Ser. No. 13/615,661 filed on Sep. 14, 2012, now allowed, which is incorporated by reference herein in its entirety.

BACKGROUND OF THE INVENTION

1. Field of the Invention

The present disclosure relates to an array substrate, and more particularly to an array substrate formed by a process-simplified manufacturing method.

2. Description of the Prior Art

In the present technique of full color display, active matrix display apparatuses, such as active matrix liquid crystal display (AMLCD) and active matrix organic light emitting diodes (AMOLED), an array substrate comprising a plurality of thin film transistors (TFTs) arranged in a matrix is required to be employed to drive the display media (such as liquid crystal molecules or organic light emitting layer). The display images may then be generated by combining pixels and mixing colors of the pixels.

The structures of an array substrate and a TFT will vary according to the different semiconductor materials used. In the present display industry, the generally used semiconductor materials include amorphous silicon semiconductor material, polysilicon semiconductor material, organic semiconductor material and oxide semiconductor material. The structure design of an array substrate and the complexity of the manufacturing process are chosen according to the intrinsic property of the semiconductor material and the compatibility of the materials in the TFT and the array substrate. In order to improve the quality of the array substrate and the TFT, a complicated structure is necessary. For example, an etching stop layer may be used to protect a semiconductor layer. However, it also brings in more complexity in the manufacturing process and increases the cost.

SUMMARY OF THE INVENTION

It is one of the objectives of the disclosure to provide an array substrate. By adjusting the manufacturing processes of a semiconductor layer and an etching stop layer, a simplified manufacturing process with a reduced number of photomasks can be achieved and an array substrate can be formed by this process-simplified manufacturing method.

To achieve the purposes described above, a preferred embodiment provides an array substrate. The array substrate comprises a substrate, a thin film transistor (TFT) and a pixel electrode. The TFT is disposed on the substrate, and the TFT comprises a gate electrode, a gate insulating layer, a patterned semiconductor layer, a patterned etching stop layer, a patterned hard mask layer, a source electrode and a drain electrode. The patterned gate insulating layer is disposed on the gate electrode. The patterned semiconductor layer is disposed on the patterned gate insulating layer. The patterned etching stop layer is disposed on the patterned semiconductor layer. The source electrode and the drain electrode are disposed on the patterned etching stop layer and the patterned semiconductor layer. The patterned hard mask layer is disposed between the source electrode and the patterned etching stop layer and disposed between the drain electrode and the patterned etching stop layer. The pixel electrode is disposed on the substrate and is electrically connected to the TFT.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
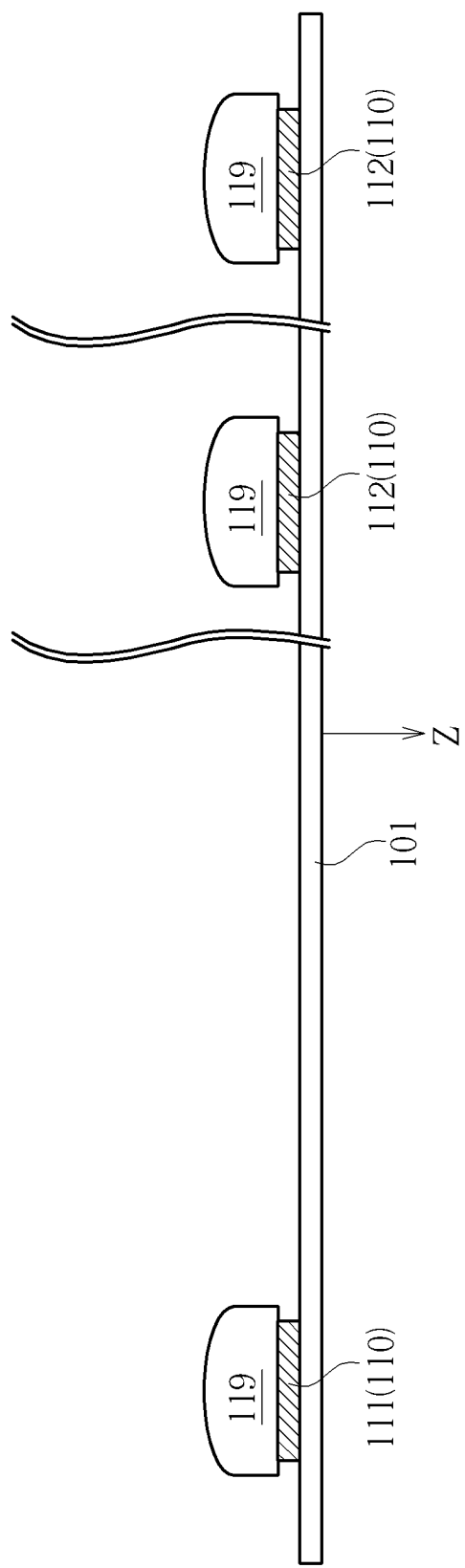
FIGS. 1-8 are schematic diagrams illustrating a manufacturing method of an array substrate according to a first preferred embodiment.
Figure 2:
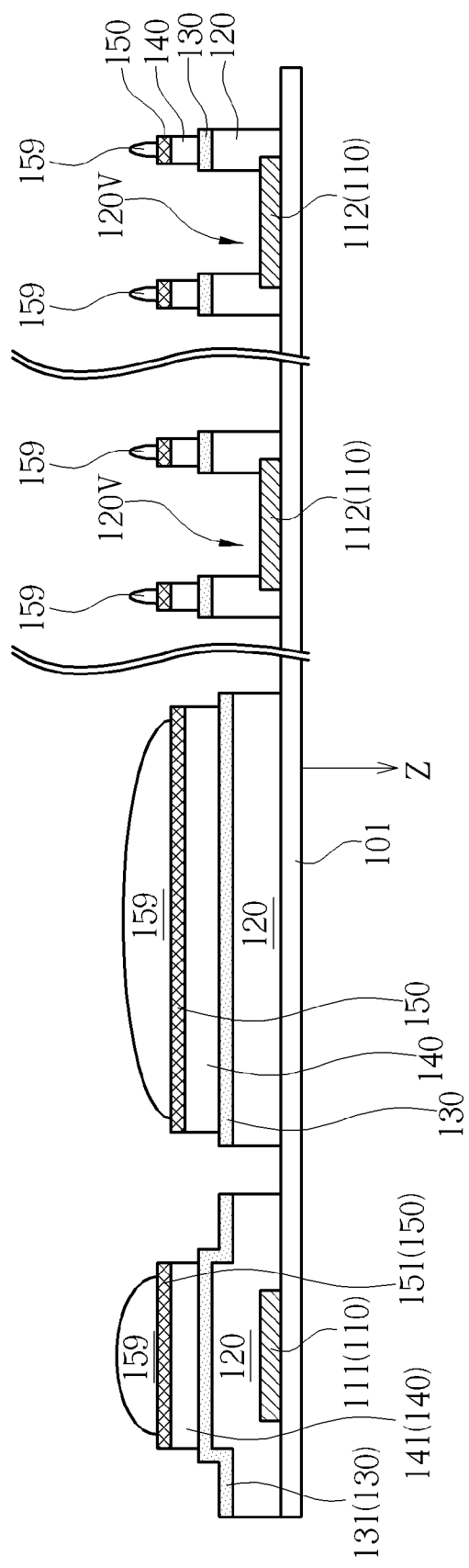
Figure 5:
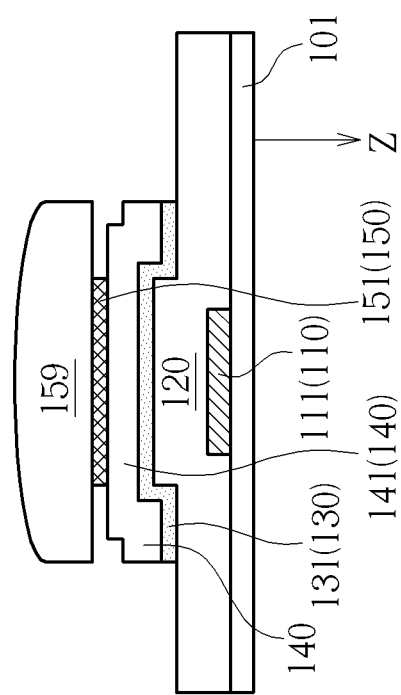
Figure 6:
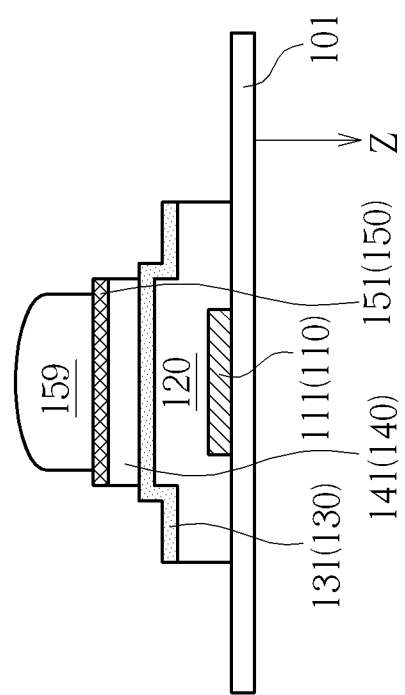
Figure 7:
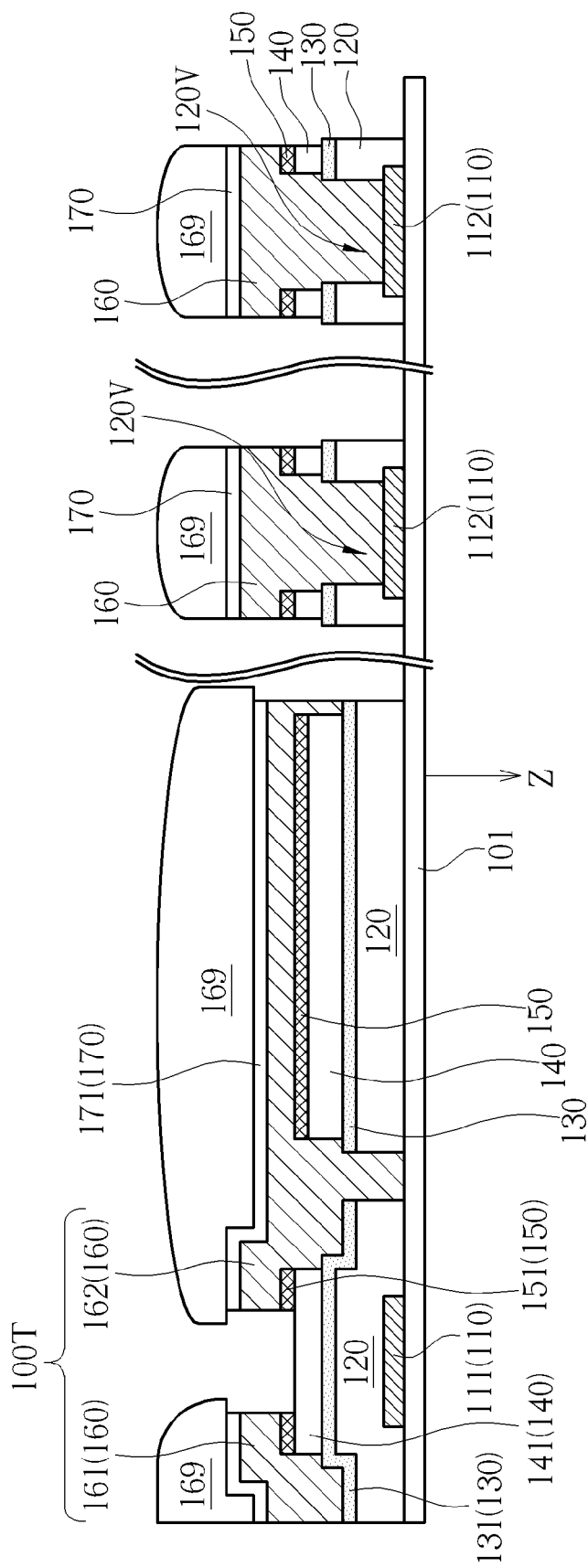
Figure 8:
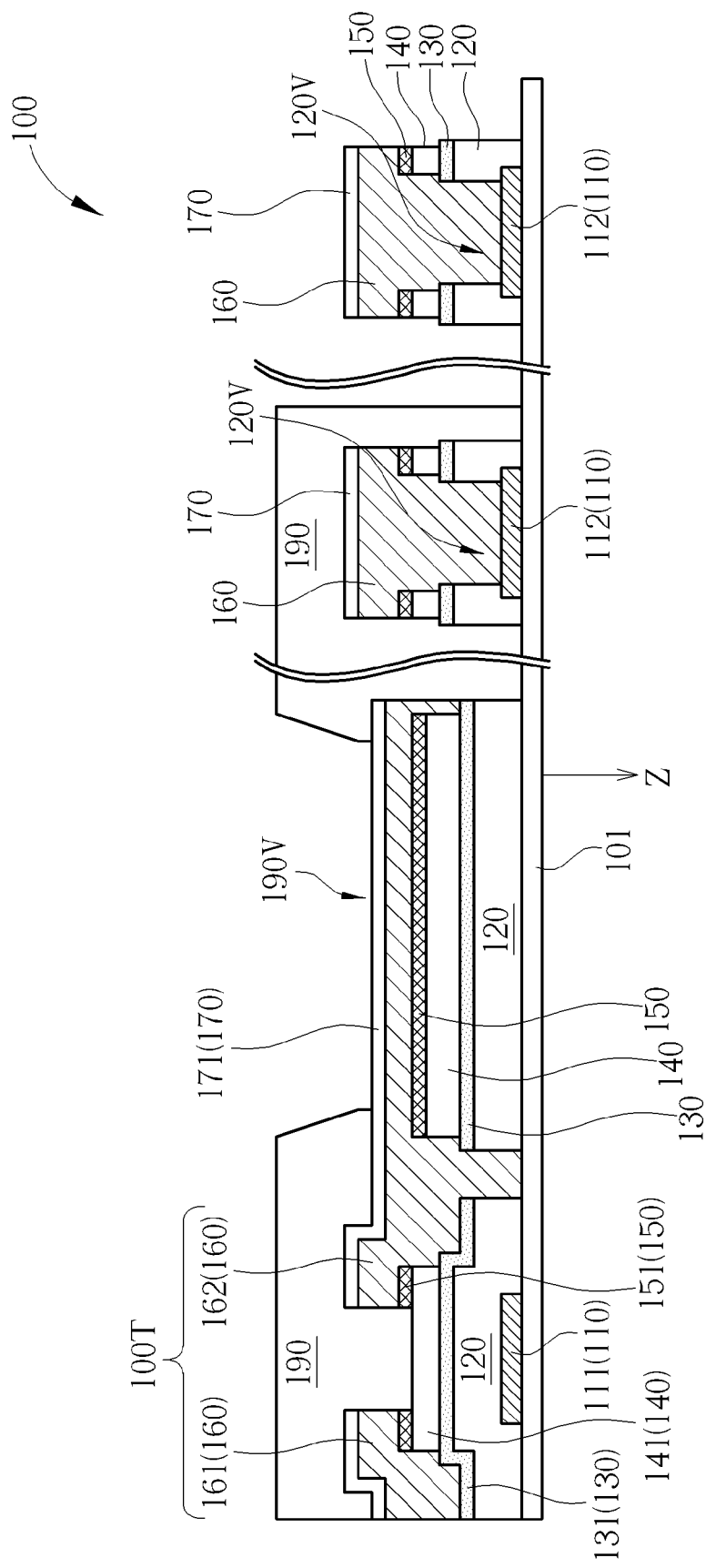

Please refer to FIGS. 1-8. FIGS. 1-8 are schematic diagrams illustrating a manufacturing method of an array substrate according to a first preferred embodiment. FIG. 1 is a schematic diagram illustrating a first photolithography process according to this embodiment. FIG. 2 is a schematic diagram illustrating a second photolithography process according to this embodiment. FIG. 7 is a schematic diagram illustrating a third photolithography process according to this embodiment. FIG. 8 is a schematic diagram illustrating a fourth photolithography process according to this embodiment. FIGS. 3-6 are schematic diagrams illustrating the detailed steps of the second photolithography process according to this embodiment. Please note that the figures are only for illustration and the figures may not be to scale. The scale may be further modified according to different design considerations. The manufacturing method of an array substrate according to this embodiment comprises the following steps. As shown in FIG. 1, a substrate 101 is provided first. Then, a first photolithography process is carried out to form a gate electrode 111 and a pad electrode 112 on the substrate 101. The first photolithography process in this embodiment may comprise the following steps. First, a first conductive layer 110 is formed on the substrate 101. A following first patterned photoresist 119 is formed on the first conductive layer 110. Then, the gate electrode 111 and the pad electrode 112 are formed through etching the first conductive layer 110 by employing the first patterned photoresist 119. But the present disclosure is not limited thereto. The gate electrode 111 and the pad electrode 112 can be formed by other methods such as nano-printing or lift-off process if necessary. The first conductive layer 110 may preferably comprise a metallic material containing at least one of aluminum (Al), copper (Cu), silver (Ag), chromium (Cr), titanium (Ti), and molybdenum (Mo), a stack layer of the above-mentioned materials, or an alloy of the above-mentioned materials, but not limited thereto. It is worth noting that each photolithography process in the present disclosure preferably includes thin film processes, photo processes, and etching processes. There is preferably only one photomask or one set of photomask required in each of the photolithography processes in this disclosure, but not limited thereto.

Figure 3:
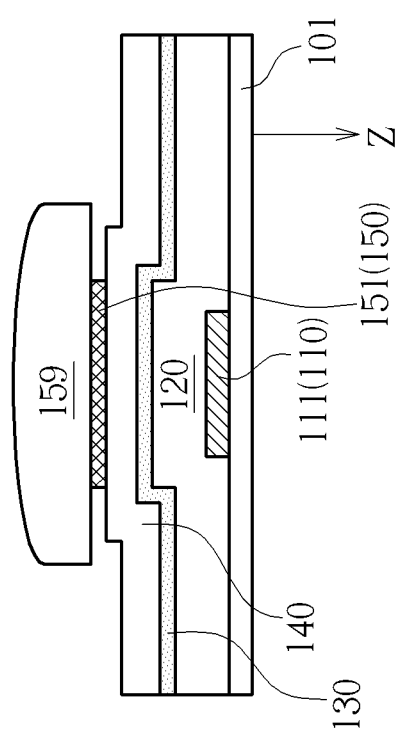

Then, as shown in FIG. 2, after the first patterned photoresist 119 is removed, a gate insulating layer 120 is formed to cover the substrate 101, the gate electrode 111 and the pad electrode 112. The second photolithography process is then carried out to form a patterned semiconductor layer 131, a patterned etching stop layer 141 and a patterned hard mask layer 151 on the gate insulating layer 120. To further explain, the second photolithography process in this embodiment comprises the following steps. First, as shown in FIG. 3, a semiconductor layer 130, an etching stop layer 140 and a hard mask layer 150 are successively formed on the gate insulating layer 120, and a second patterned photoresist 159 is formed on the hard mask layer 150. Then, an over etching process is performed to the hard mask layer 150 by employing the second patterned photoresist 159 to form a patterned hard mask layer 151 on the etching stop layer 140. In this embodiment, the semiconductor layer 130 may preferably comprise an oxide semiconductor material, an amorphous silicon semiconductor material, or a poly silicon semiconductor material. The hard mask layer 150 may preferably comprise a metallic material containing at least one of aluminum, copper, silver, chromium, titanium, and molybdenum, a stack layer of the above-mentioned materials, or an alloy of the above-mentioned materials. The etching stop layer 140 may preferably comprise an oxide such as silicon oxide, a nitride such as silicon nitride, or an oxynitride such as silicon oxynitride. But the present disclosure is not limited to the above-mentioned materials. It is worth noting that, as shown in FIG. 3, an over etching process such as a wet etching process is performed to the hard mask layer 150 by employing the second patterned photoresist 159 to make the pattern of the patterned hard mask layer 151 smaller than the pattern of the corresponding second patterned photoresist 159. Employing the above-mentioned method can help to partially expose the semiconductor layer 130 to the outside of the etching stop layer 140.

Figure 4:
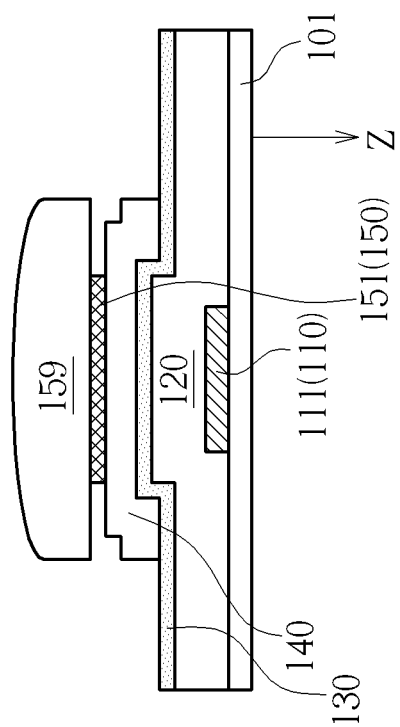

As shown in FIG. 4, after the patterned hard mask layer 151 is formed, a first etching process is performed to the etching stop layer 140 by employing the second patterned photoresist 159 for removing the etching stop layer 140 uncovered by the second patterned photoresist 159 along a direction Z perpendicular to the substrate 101. In other words, only the portion of etching stop layer 140 along the direction Z projected by the second patterned photoresist 159 is remained. The first etching process in this embodiment may preferably comprise a dry etching process to make the pattern of the etching stop layer 140 after the first etching process being substantially the same as the second patterned photoresist 159, but it is not limited thereto. Then, as shown in FIG. 5, a second etching process is performed to the semiconductor layer 130 by employing the second patterned photoresist 159 to form the patterned semiconductor layer 131 on the gate insulating layer 120. The second etching process in this embodiment can be adjusted according to the compatibility and the material characteristics of the semiconductor layer 130. For example, a wet etching method can be adopted for the second etching process when the semiconductor layer 130 is an oxide semiconductor such as indium gallium zinc oxide (IGZO) or zinc oxide (ZnOx), but it is not limited thereto.

As shown in FIG. 6, after the patterned semiconductor layer 131 is formed, an etching process can be performed to remove the etching stop layer 140 uncovered by the patterned hard mask layer 151 for forming a patterned etching stop layer 141 on the patterned semiconductor layer 131. It is worth noting that the etching method in this embodiment is preferably an etching process with high etching selectivity between the hard mask layer 150 and the etching stop layer 140 such as a dry etching, so as to make the pattern of the etching stop layer 141 being substantially the same as the patterned hard mask layer 151 and to make the patterned semiconductor layer 131, which is originally covered by the etching stop layer 140, being partially exposed for contacting with the subsequent source electrode/drain electrode. In addition, in other embodiments of this disclosure, an ashing process can also be selected to remove at least a part of the second patterned photoresist 159 so as to at least partially expose the patterned hard mask 151 to the outside of the second patterned photoresist 159. Then, the etching stop layer 140 uncovered by the patterned hard mask 151 is etched. Or, if necessary, the second patterned photoresist 159 can be entirely removed first, and the etching stop layer 140 uncovered by the patterned hard mask layer 151 is then etched by employing the patterned hard mask layer 151 directly. Moreover, as shown in FIG. 6 and FIG. 2, the second photolithography process in this embodiment may further comprise removing the gate insulating layer 120 uncovered by the patterned semiconductor layer 131 in the step of etching the etching stop layer 140 uncovered by the patterned hard mask layer 151 so as to form a contact opening 120V in the gate insulating layer 120. The contact opening 120V at least partially exposes the pad electrode 112. Since the patterned semiconductor layer 131, the patterned etching stop layer 141, the patterned hard mask layer 151 and the contact opening 120V can be formed through etching processes by employing the second patterned photoresist 159, which is formed by using only one photomask in the second photolithography process of this embodiment, a simplified manufacturing process and a reduced number of used photomasks can be achieved. It is worth noting that, in other preferred embodiments of this disclosure, the patterned hard mask layer 151 can be removed after the patterned etching stop layer 141 is formed and before a second conductive layer (not shown in FIG. 6) is formed in the following third photolithography process if necessary, but it is not limited thereto. It is worth noting that since the patterned hard mask layer 151 is used to define the patterned etching stop layer 141 in this embodiment, the line width controlling and the uniformity of the patterned etching stop layer 141 can be improved, and the electrical quality of the array substrate can be improved accordingly.

Then, as shown in FIG. 7, after the second patterned photoresist 159 is removed, a third photolithography process is carried out to form a source electrode 161, a drain electrode 162 and a pixel electrode 171 on the patterned etching stop layer 141 and the patterned semiconductor layer 131. In further description, the third photolithography process in this embodiment may comprise the following steps. First, a second conductive layer 160 is formed to cover the patterned hard mask layer 151 and the patterned semiconductor layer 131. The second conductive layer 160 may preferably comprise a metallic material containing at least one of aluminum, copper, silver, chromium, titanium, and molybdenum, a stack layer of the above-mentioned materials, or an alloy of the above-mentioned materials, but it is not limited thereto and other conductive materials can also be used. It is worth noting that the second conductive layer 160 can be electrically connected to the pad electrode 112 via the contact opening 120V. Then, a transparent conductive layer 170 is formed on the second conductive layer 160 and a third patterned photoresist 169 is formed on the transparent conductive layer 170. Then, the transparent conductive layer 170 and the second conductive layer 160 uncovered by the third patterned photoresist 169 can be removed through an etching process for forming the pixel electrode 171, the source electrode 161 and the drain electrode 162, and a thin film transistor 100T is accordingly formed on the substrate 101. It is worth noting that at least a part of the patterned hard mask layer 151 uncovered by the third patterned photoresist 169 and the second conductive layer 160 can be removed when forming the source electrode 161 and the drain electrode 162 so as to prevent the source electrode 161 and the drain electrode 162 from being electrically connected to each other directly.

As shown in FIG. 8, after the third patterned photoresist is removed or after the third photolithography process, a fourth photolithography process is then carried out to form an isolation layer 190 on the source electrode 161 and the drain electrode 162. The isolation layer 190 preferably has a pixel opening 190V so as to at least partially expose the pixel electrode 171. The isolation layer 190 in this embodiment may preferably comprise an organic material such as acrylic resin, or an inorganic material such as silicon nitride, silicon oxide, and silicon oxynitride, or other appropriate isolation materials. An array substrate 100 can be formed through the above-mentioned steps. It is worth noting that the isolation layer 190 may selectively cover only a part of the pad electrode 112, a part of the corresponding second conductive layer 160 and a part of the corresponding transparent conductive layer 170, and may expose a part of the second conductive layer 160 and a part of the transparent conductive layer 170 corresponding to the pad electrode 112. Then an outside circuit or an outside device (not shown) can be electrically connected to the array substrate 100 via the pad electrode 112 uncovered by the isolation layer 190. The line width controlling of the patterned etching stop layer 141 can be improved by using the manufacturing method of the array substrate in this embodiment, and the electrical property of the corresponding thin film transistor 100T and the uniformity of the electrical property in each region on the array substrate 100 can be improved accordingly, and a simplified manufacturing process with a reduced number of used photomask can be achieved.

Please refer to FIG. 8 again. As shown in FIG. 8, an array substrate 100 is provided in this embodiment. The array substrate 100 comprises a substrate 101, a thin film transistor 100T, and a pixel electrode 171. The thin film transistor 100T is disposed on the substrate 101, and the thin film transistor 100T comprises a gate electrode 111, a gate insulating layer 120, a patterned semiconductor layer 131, a patterned etching stop layer 141, a patterned hard mask layer 151, a source electrode 161 and a drain electrode 162. The gate insulating layer 120 is disposed on the gate electrode 111. The patterned semiconductor layer 131 is disposed on the gate insulating layer 120. The patterned etching stop layer 141 is disposed on the patterned semiconductor layer 131. The source electrode 161 and the drain electrode 162 are disposed on the patterned etching stop layer 141 and the patterned semiconductor layer 131, and the patterned hard mask layer 151 is disposed between the source electrode 161 and the patterned etching stop layer 141 and is disposed between the drain electrode 162 and the patterned etching stop layer 141. The pixel electrode 171 is disposed on the substrate 101, and the pixel electrode 171 is electrically connected to the thin film transistor 100T. In addition, the array substrate 100 in this embodiment further comprises an isolation layer 190 disposed on the substrate 101 and the isolation layer 190 covers the thin film transistor 100T. The isolation layer 190 has a pixel opening 190V, and the pixel opening 190V at least partially exposes the pixel electrode 171. In this embodiment, the pixel electrode 171 is disposed on the drain electrode 162, and the pixel electrode 171 at least partially overlaps the patterned semiconductor layer 131 along the direction Z perpendicular to the substrate 101. In further description, since the drain electrode 162 in this embodiment may comprise an opaque conductive material, the pixel electrode 171 in the region of the pixel opening 190V can overlap the patterned semiconductor layer 131 along the direction Z. In this embodiment, the patterned semiconductor layer 131 may preferably comprise an oxide semiconductor material, an amorphous silicon semiconductor material or a poly silicon semiconductor material, but not limited thereto. Furthermore, the array substrate 100 in this embodiment can be applied in a liquid crystal display, an organic electroluminescent display, an electro wetting display or an electronic paper display, but not limited thereto. For example, when the array substrate 100 is applied in an organic electroluminescent display, the organic display material can be disposed in the pixel opening 190V. By the disposition of the isolation layer 190, the organic display materials for displaying different colors are isolated in respective pixel openings, and the mutual pollution can be avoided. In addition, when the drain electrode 162 in this embodiment is an opaque conductive material, the organic electroluminescent display employing the array substrate 100 may be a top emission organic electroluminescent display, but it is not limited thereto.

The following description is based on different embodiments of the array substrate in the present disclosure. To simplify the description, the following description will focus on the differences among embodiments rather than the similar parts. Furthermore, the same reference numbers are used to describe similar elements in the description of different embodiments for convenience and clarity.

Figure 9:
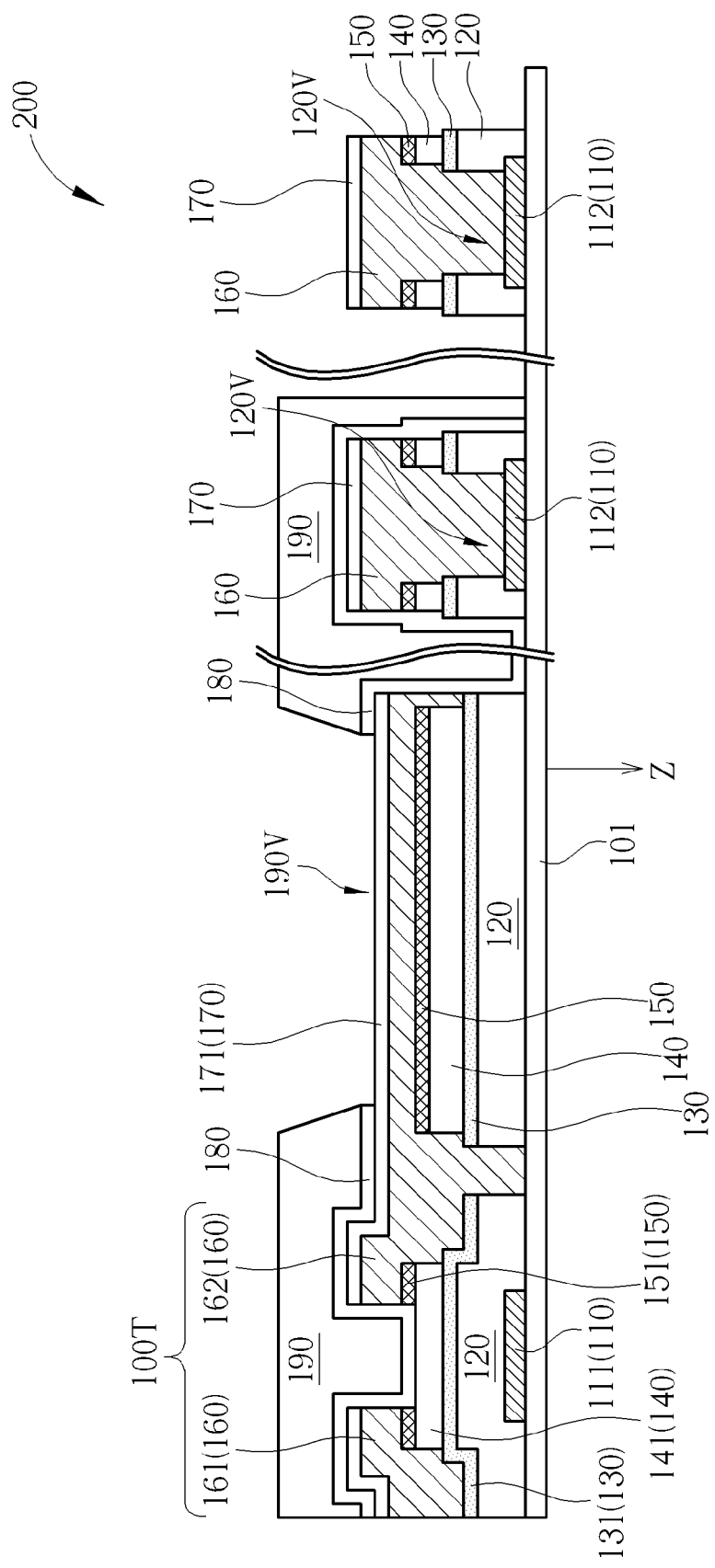
FIG. 9 is a schematic diagram illustrating a manufacturing method of an array substrate according to a second preferred embodiment.

Please refer to FIG. 9, and also refer to FIGS. 1-7. FIG. 9 is a schematic diagram illustrating a manufacturing method of an array substrate according to a second preferred embodiment. As shown in FIG. 9, comparing with the manufacturing method of an array substrate according to the first preferred embodiment, the fourth photolithography process in this embodiment further comprises a step of forming a protective layer 180 before forming the isolation layer 190, so as to at least partially cover the source electrode 161, the drain electrode 162 and the patterned etching stop layer 141, and to form the array substrate 200 as shown in FIG. 9. The protective layer 180 may preferably comprise an oxide such as aluminium oxide or silicon oxide, a nitride such as silicon nitride, an oxynitride such as silicon oxynitride, or other materials suitable for a protective layer, to compensate the insufficient protective effect due to the material used for the isolation layer 190. Apart from the protective layer 180 disposed between the isolation layer 190 and the thin film transistor 100T in this embodiment, the disposition of the workpiece and the material characteristic of the array substrate 200 in this embodiment are similar to the array substrate 100 in the first preferred embodiment and will not be redundantly described.

Figure 10:
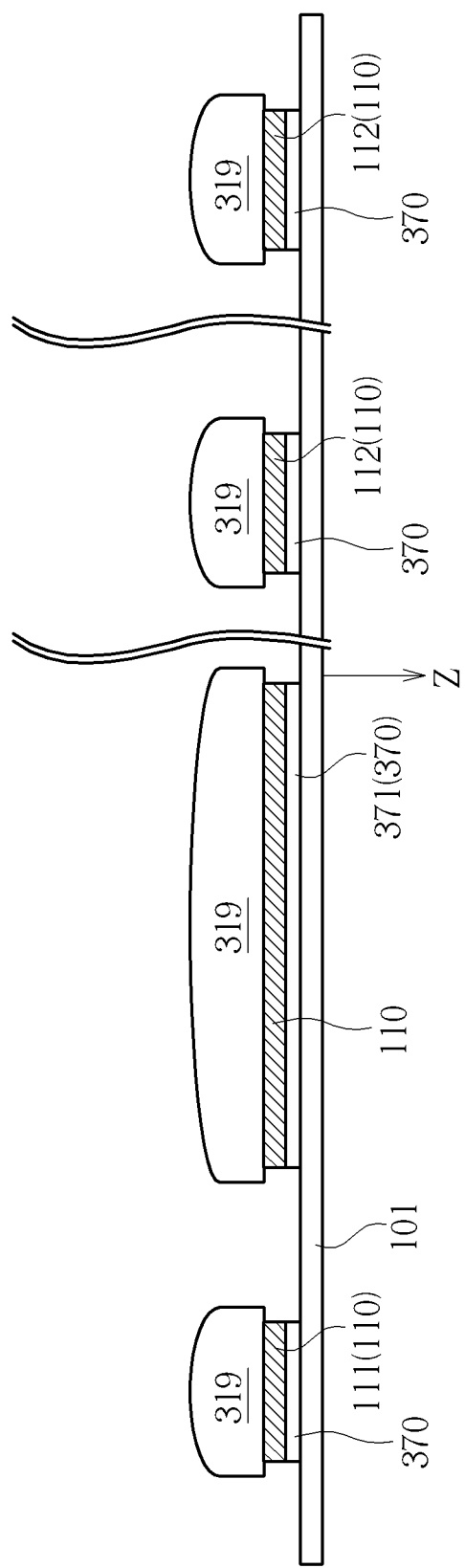
FIGS. 10-13 are schematic diagrams illustrating a manufacturing method of an array substrate according to a third preferred embodiment.
Figure 11:
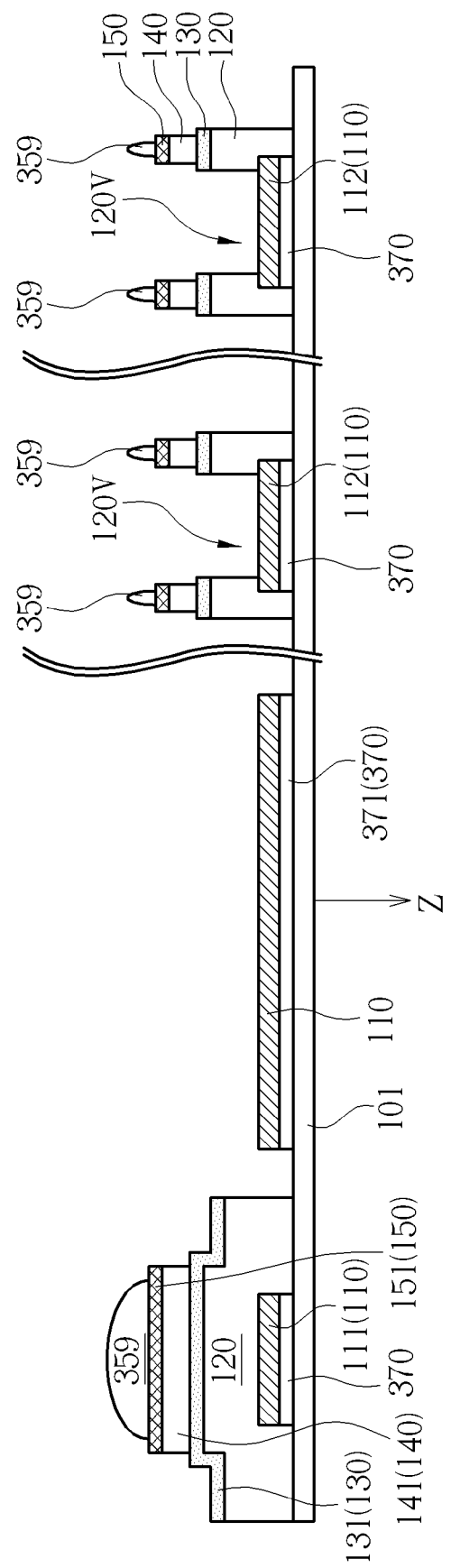
Figure 12:
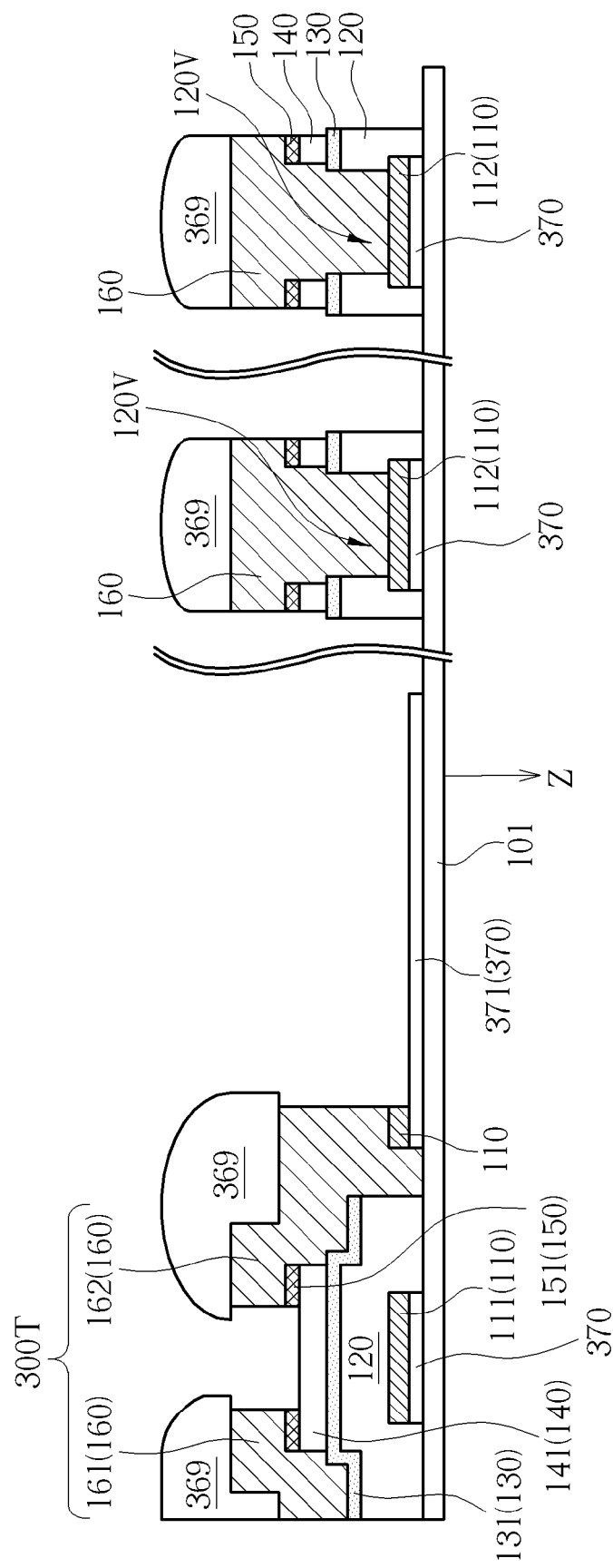
Figure 13:
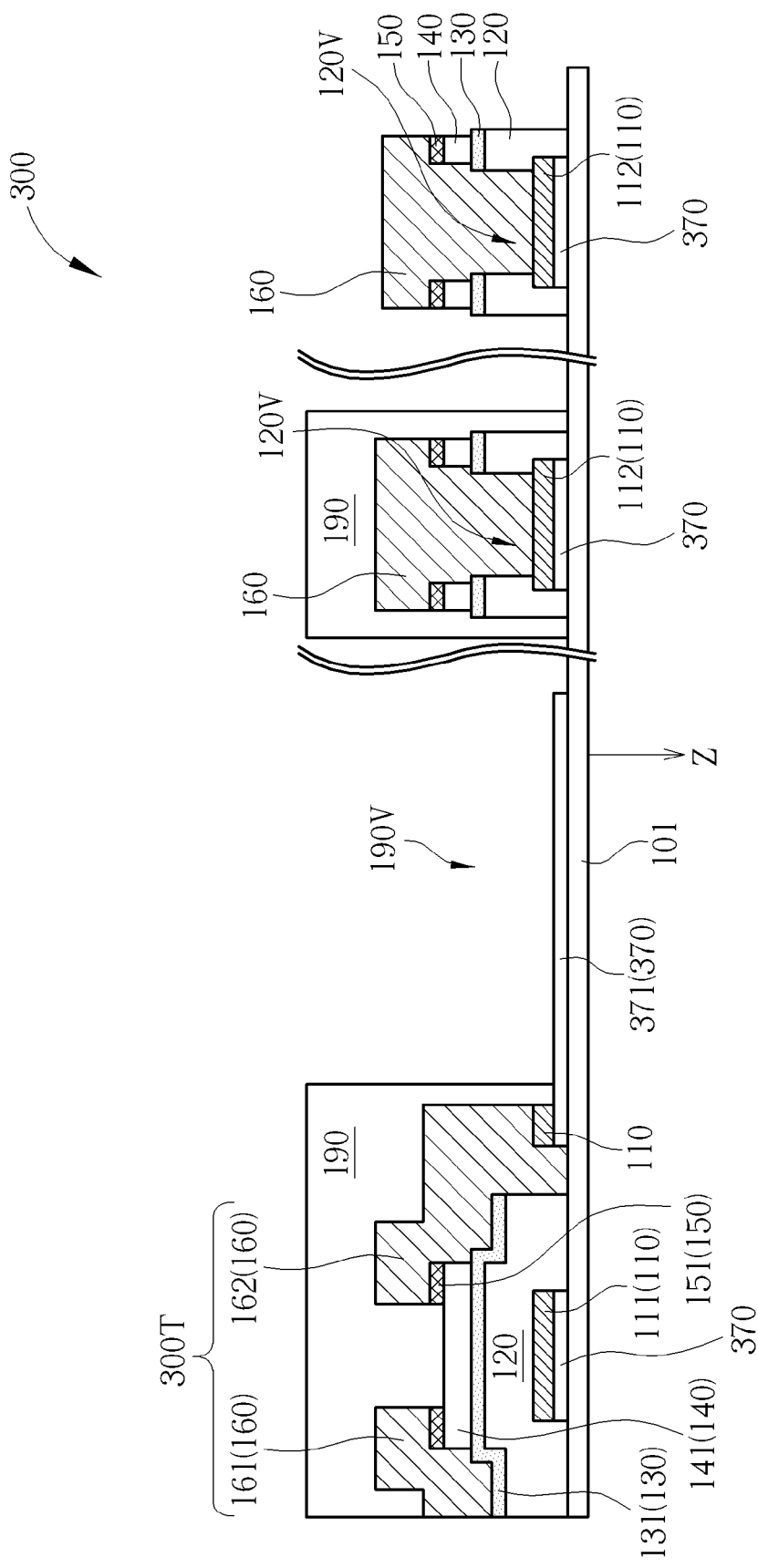

Please refer to FIGS. 10-13. FIGS. 10-13 are schematic diagrams illustrating a manufacturing method of an array substrate according to a third preferred embodiment. FIG. 10 is a schematic diagram illustrating a first photolithography process in this embodiment, FIG. 11 is a schematic diagram illustrating a second photolithography process in this embodiment, FIG. 12 is schematic diagram illustrating a third photolithography process in this embodiment, and FIG. 13 is schematic diagram illustrating a fourth photolithography process in this embodiment. As shown in FIG. 10, comparing with the manufacturing method of an array substrate according to the first preferred embodiment, the first photolithography process in this embodiment comprises the following steps. First, a transparent conductive layer 370 and a first conductive layer 110 are formed on the substrate 101 successively, and a first patterned photoresist 319 is formed on the first conductive layer 110. The first conductive layer 110 and the transparent conductive layer 370 uncovered by the first patterned photoresist 319 are then removed for forming the gate electrode 111, the pad electrode 112 and a pixel electrode 371. Then, as shown in FIG. 11, a gate insulating layer 120 is formed to cover the substrate 101, the gate electrode 111, the pad electrode 112 and the pixel electrode 371 after the first patterned photoresist 319 is removed. A second photolithography process is then carried out to form a patterned semiconductor layer 131, a patterned etching stop layer 141 and a patterned hard mask layer 151 on the gate insulating layer 120. It is worth noting that a second patterned photoresist 359 used in this embodiment preferably does not cover the pixel electrode 371 along the direction Z for conveniently removing the gate insulating layer 120, the semiconductor layer 130, the etching stop layer 140 and the hard mask layer 150 on the pixel electrode 371, but it is not limited thereto. Except the pattern distribution of the second patterned photoresist 359 in the second photolithography process in this embodiment is different from that of the above mentioned second patterned photoresist 159, the other steps in this embodiment are similar to the above mentioned first preferred embodiment. The related detailed steps may be referred to the above mentioned content and FIGS. 3-6, and it will not be redundantly described.

Then, as shown in FIG. 12, after the second patterned photoresist 359 is removed, a third photolithography process is carried out to form a source electrode 161 and a drain electrode 162 on the patterned etching stop layer 141 and the patterned semiconductor layer 131. In further description, the third photolithography process in this embodiment may comprise the following steps. First, a second conductive layer 160 is formed to cover the patterned hard mask layer 151, the patterned semiconductor layer 131 and a part of the first conductive layer 110. The second conductive layer 160 can be electrically connected to the pad electrode 112 via the contact opening 120V. A third patterned photoresist 369 is formed on the second conductive layer 160. Then, an etching process can be used to remove the second conductive layer 160 uncovered by the third patterned photoresist 369 to form the source electrode 161 and the drain electrode 162, and to form a thin film transistor 300T on the substrate 101 accordingly. It is worth noting that the third photolithography process in this embodiment, at least a part of the first conductive layer 110 uncovered by third patterned photoresist 369 can be removed simultaneously when the second conductive layer 160 uncovered by the third patterned photoresist 369 is removed, to at least partially expose the pixel electrode 371. More precisely, the first conductive layer 110 on the pixel electrode 371 can be etched simultaneously in the step of performing an etching process to the second conductive layer 160 in the third photolithography process in this embodiment. In addition, when the source electrode 161 and the drain electrode 162 are formed, at least a part of the patterned hard mask layer 151 uncovered by the third patterned photoresist 369 and the second conductive layer 160 can be removed simultaneously, so as to prevent the source electrode 161 and the drain electrode 162 from being electrically connected to each other directly.

As shown in FIG. 13, after the third patterned photoresist 369 is removed or after the third photolithography process, a fourth photolithography process can be carried out to form an isolation layer 190 on the source electrode 161 and the drain electrode 162, and the isolation layer 190 preferably has a pixel opening 190V to at least partially expose the pixel electrode 171. An array substrate 300 as shown in FIG. 13 can be formed through the above-mentioned steps. It is worth noting that the pixel electrode 371 is at least partially disposed between the drain electrode 162 and the substrate 101 in the array substrate 300 of this embodiment. In other words, the drain electrode 162 preferably at least partially overlaps the pixel electrode 371 along the direction Z perpendicular to the substrate 101 to make the pixel electrode 371 electrically connected to the thin film transistor 300T, but this disclosure is not limited thereto. In other embodiments, other bridge connecting methods for making the pixel electrode 371 electrically connected to the thin film transistor 300T can also be used. The disposition of the workpiece and the material characteristic of the array substrate 300 are similar to the array substrate 100 of the first preferred embodiment except the disposition of the pixel electrode 371 and the transparent conductive layer 370. So it will not be redundantly described here. It is worth noting that the array substrate 300 in this embodiment can also be applied in a liquid crystal display, an organic electroluminescent display, an electro wetting display or an electronic paper display, but not limited thereto. In addition, since there is no other transparent material covering the pixel electrode 371 at the pixel opening 190V along the direction Z, an organic electroluminescent display including the array substrate 300 can be a top emission organic electroluminescent display, a bottom emission organic electroluminescent display, or a two-sided emission organic electroluminescent display regarding the position of the reflective layer (not shown).

Figure 14:
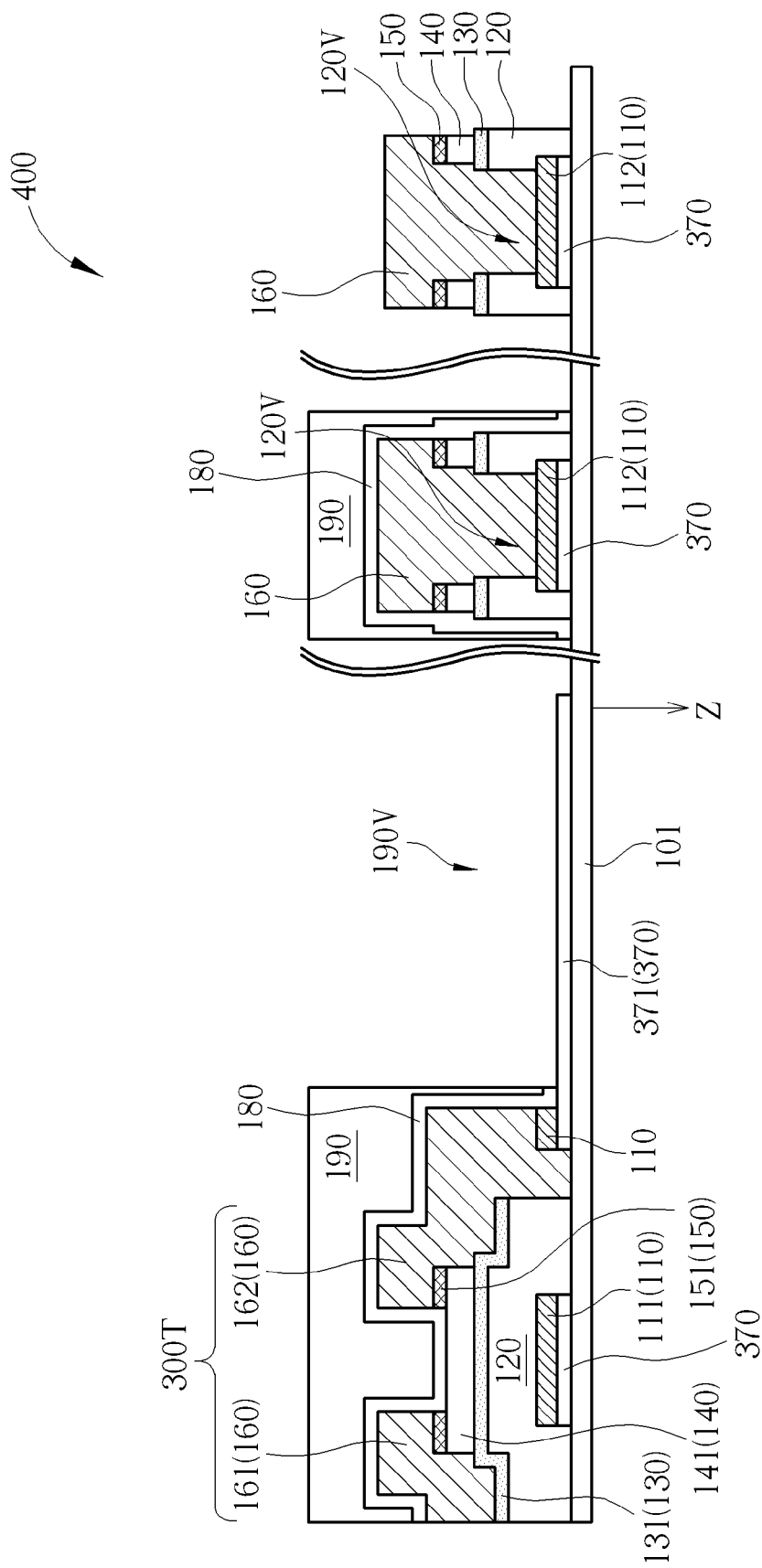
FIG. 14 is a schematic diagram illustrating a manufacturing method of an array substrate according to a fourth preferred embodiment.

Please refer to FIG. 14, and also refer to FIGS. 10-12. FIG. 14 is a schematic diagram illustrating a manufacturing method of an array substrate according to a fourth preferred embodiment. As shown in FIG. 14, comparing with the manufacturing method of an array substrate according to the third preferred embodiment, the fourth photolithography process in this embodiment further comprises a step of forming a protective layer 180 before forming the isolation layer 190, so as to at least partially cover the source electrode 161, the drain electrode 162 and the patterned etching stop layer 141, and to form the array substrate 400 as shown in FIG. 14. The protective layer 180 may preferably comprise an oxide such as aluminium oxide or silicon oxide, a nitride such as silicon nitride, an oxynitride such as silicon oxynitride, or other materials suitable for a protective layer, to compensate the insufficient protective effect due to the material used for the isolation layer 190. Apart from the protective layer 180 disposed between the isolation layer 190 and the thin film transistor 300T in this embodiment, the disposition of the workpiece and the material characteristic of the array substrate 400 in this embodiment are similar to the array substrate 300 in the third preferred embodiment and will not be redundantly described.

Figure 15:
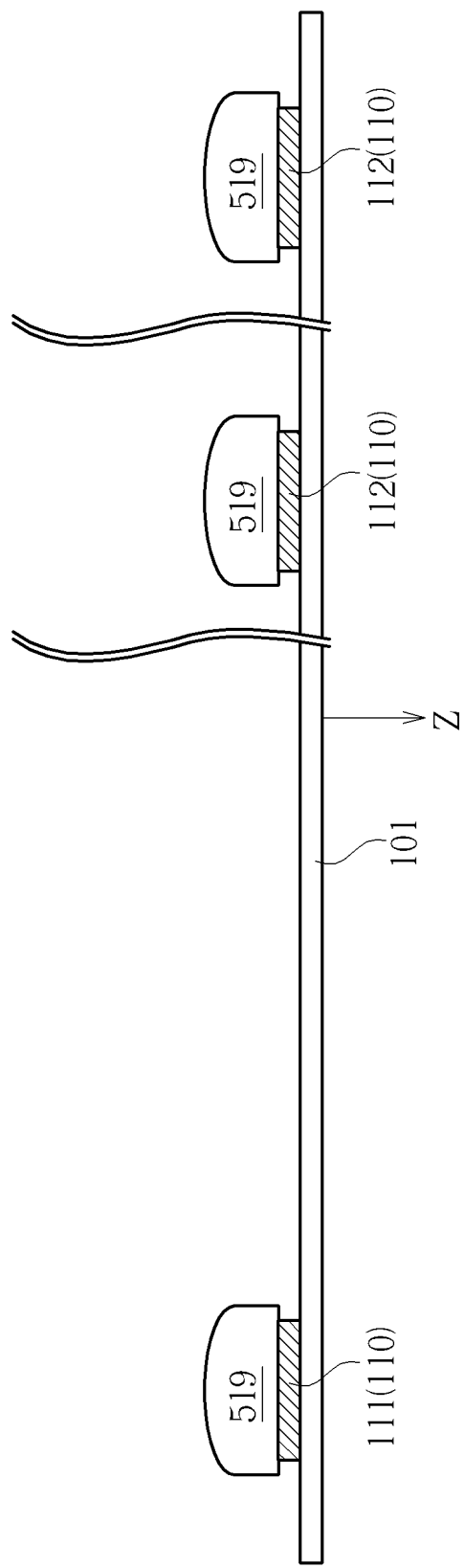
FIGS. 15-21 are schematic diagrams illustrating a manufacturing method of an array substrate according to a fifth preferred embodiment.
Figure 16:
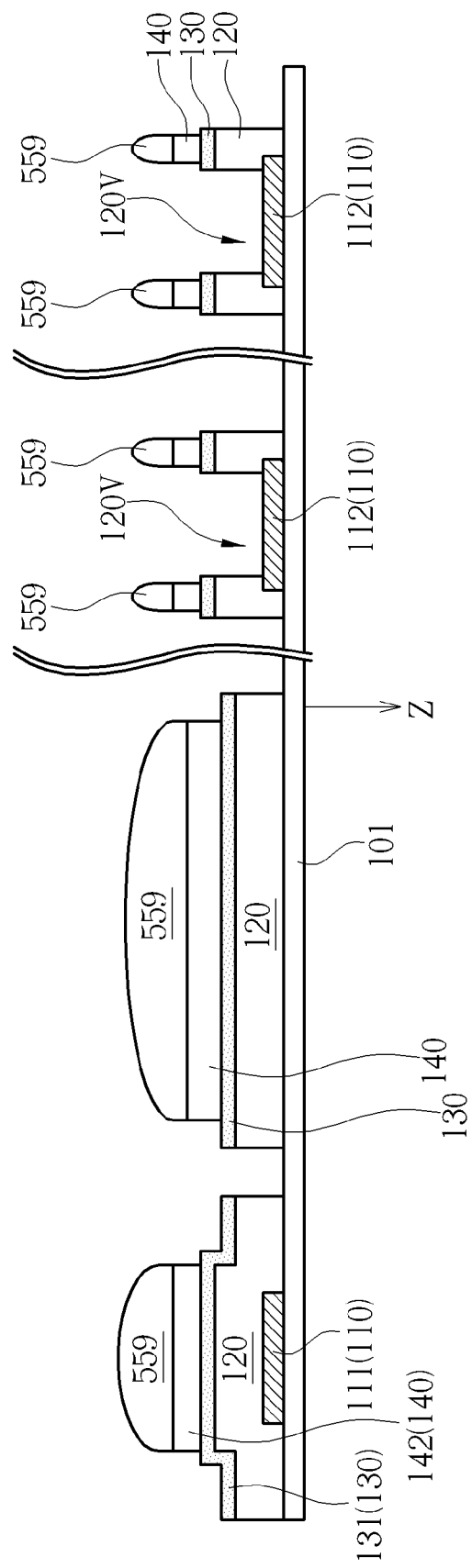
Figure 17:
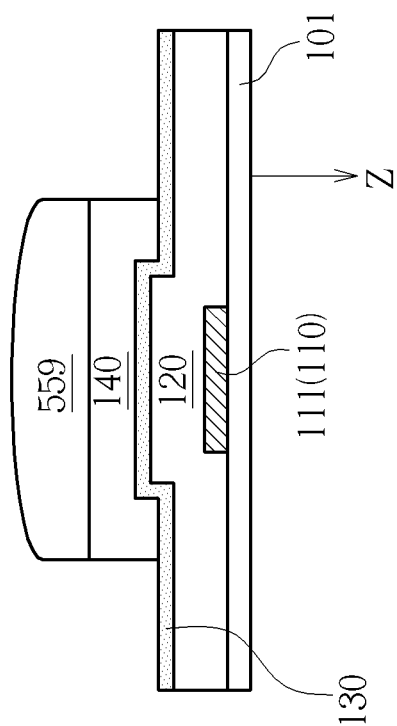
Figure 18:
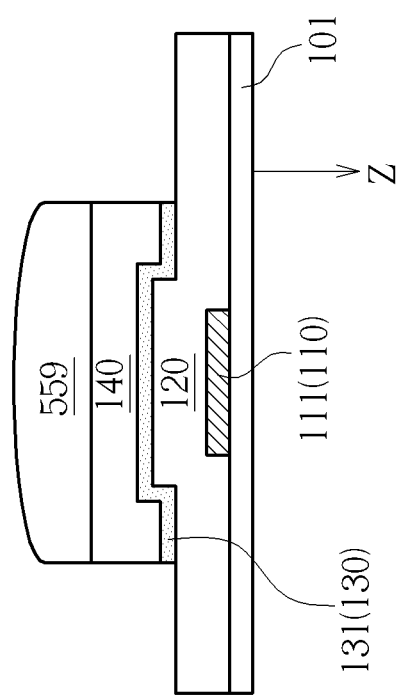
Figure 19:
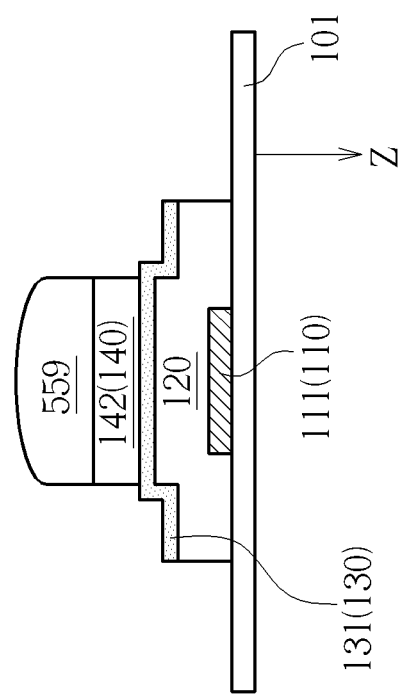
Figure 20:
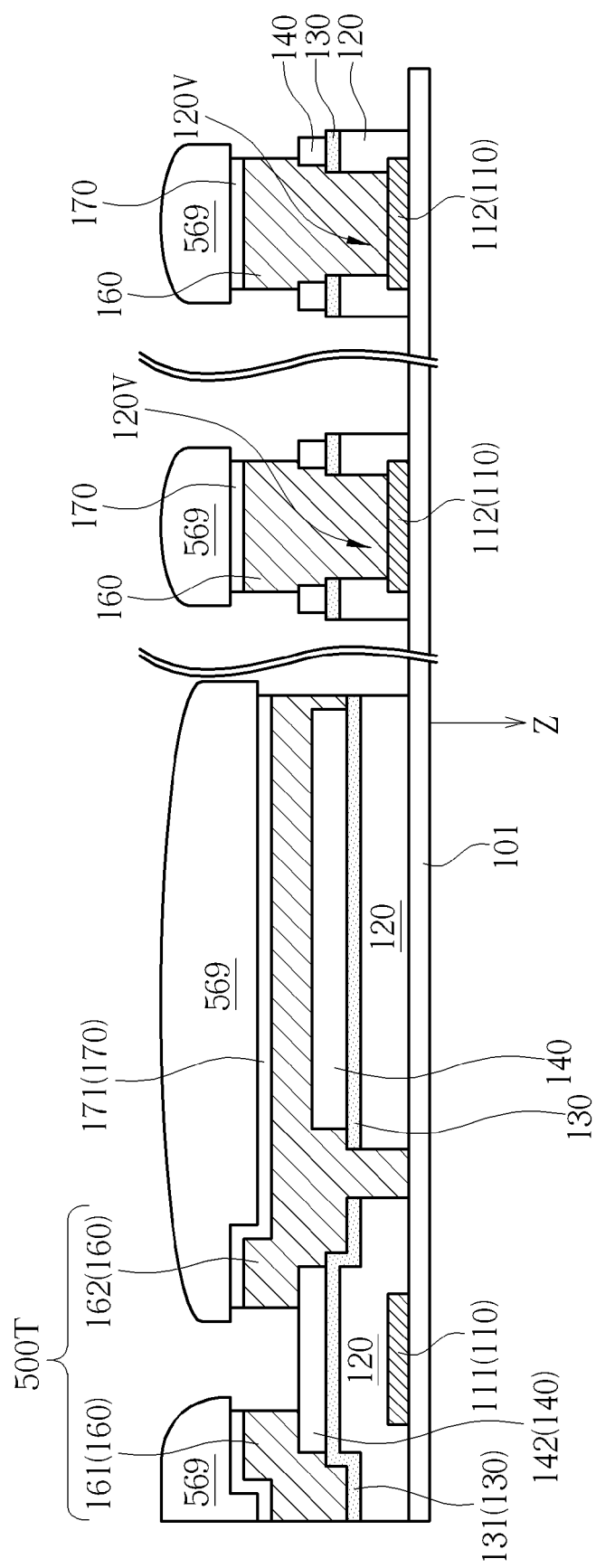
Figure 21:
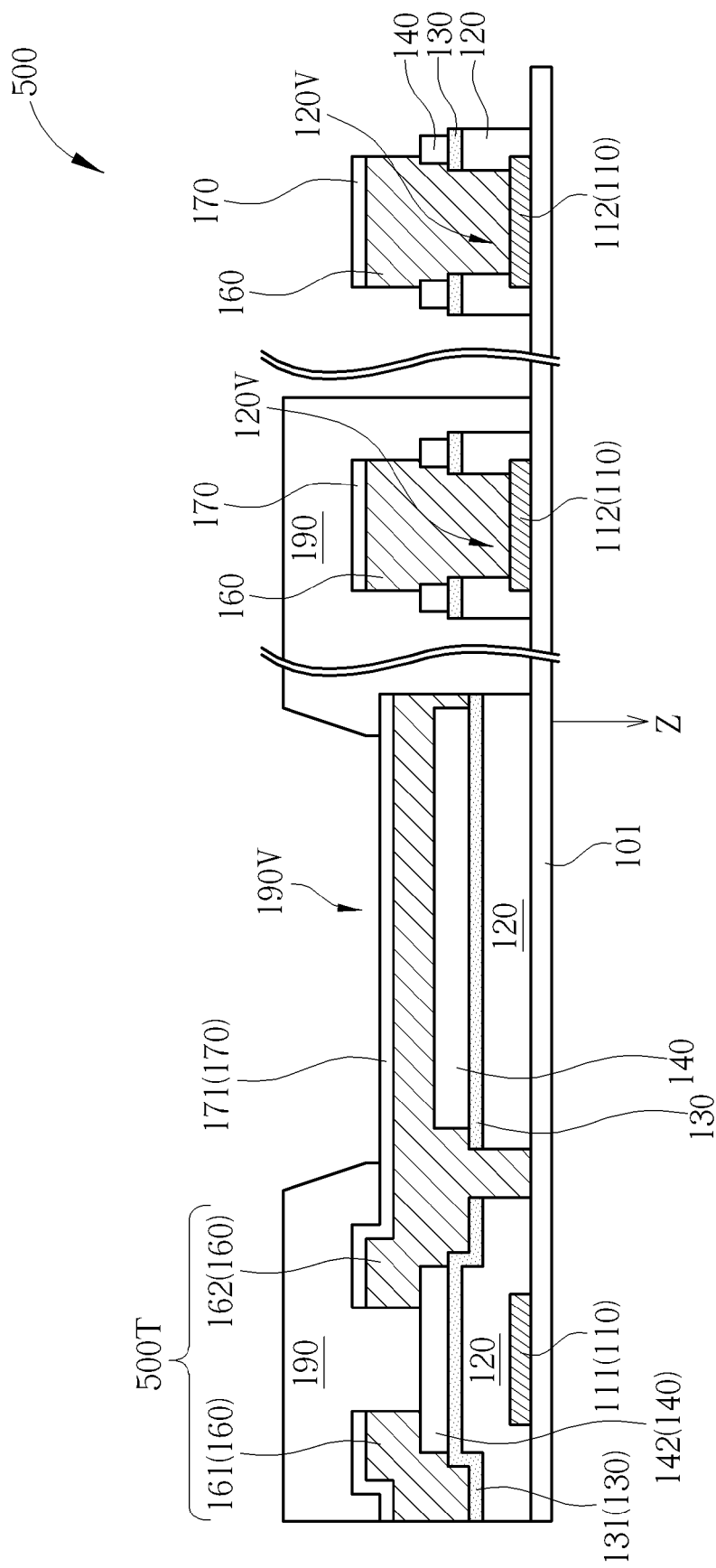

Please refer to FIGS. 15-21. FIGS. 15-21 are schematic diagrams illustrating a manufacturing method of an array substrate according to a fifth preferred embodiment. FIG. 15 is a schematic diagram illustrating a first photolithography process in this embodiment. FIG. 16 is a schematic diagram illustrating a second photolithography process in this embodiment. FIG. 20 is a schematic diagram illustrating a third photolithography process in this embodiment. FIG. 21 is a schematic diagram illustrating a fourth photolithography process in this embodiment. FIGS. 17-19 are schematic diagrams illustrating the detailed steps of the second photolithography process in this embodiment. The manufacturing method of an array substrate according to this embodiment comprises the following steps. First, as shown in FIG. 15, a substrate 101 is provided and the first photolithography process is carried out to form the gate electrode 111 and the pad electrode 112 through etching the first conductive layer 110 by employing a first patterned photoresist 519.

Then, as shown in FIG. 16, a gate insulating layer 120 is formed to cover the substrate 101, the gate electrode 111 and the pad electrode 112 after the first patterned photoresist 519 is removed. The second photolithography process is then carried out to form a patterned semiconductor 131 and a patterned etching stop layer 142 on the gate insulating layer 120. In further description, the second photolithography process in this embodiment comprises the following steps. First, as shown in FIG. 17, a semiconductor layer 130 and an etching stop layer 140 are successively formed on the gate insulating layer 120, and a second patterned photoresist 559 is formed on the etching stop layer 140. Then, the second patterned photoresist 559 is employed in an etching process on the etching stop layer 140 so as to remove the etching stop layer 140 uncovered by the second patterned photoresist 559. Then, as shown in FIG. 18, the semiconductor layer 130 uncovered by the second patterned photoresist 559 is removed for forming the patterned semiconductor layer 131 on the gate insulating layer. Then, as shown in FIG. 19, the second patterned photoresist 559 and the etching stop layer 140 are etched for forming the patterned etching stop layer 142 on the patterned semiconductor layer 131. It is worth noting that as shown in FIG. 19, a dry etching process is preferably used in this embodiment to etch the second patterned photoresist 559 and the etching stop layer 140 simultaneously, and to make the pattern of the patterned etching stop layer 142 smaller than the pattern of the patterned semiconductor layer 131. In other words, the patterned semiconductor layer 131 can be partially exposed to the outside of the etching stop layer 140 through this etching method, and it helps the following contact with the source electrode/drain electrode. In addition, the condition of the above-mentioned etching process can be adjusted to etch the etching stop layer 140 and to deal with the exposed portion of the patterned semiconductor layer 131 at the same time for reducing the following contact resistance between the patterned semiconductor 131 and the source electrode/drain electrode in this embodiment. Furthermore, as shown in FIG. 19 and FIG. 16, the second photolithography process in this embodiment further comprises removing the gate insulating layer 120 uncovered by the patterned semiconductor layer 131 in the step of etching the second patterned photoresist 559 and the etching stop layer 140 for forming a contact opening 120V in the gate insulating layer 120, and the contact opening 120 at least partially exposes the pad electrode 112. Since only one single photomask is used in the second photolithography process of this embodiment to form the second patterned photoresist 559, which may be employed for performing other etching processes to form the patterned semiconductor layer 131, the patterned etching stop layer 142 and the contact opening 120V, a simplified manufacturing process with a reduced number of used photomask can be achieved.

Then, as shown in FIG. 20, a third photolithography process is carried out with a third patterned photoresist 569 after removing the second patterned photoresist 559, so as to form a pixel electrode 171, a source electrode 161 and a drain electrode 162 on the patterned etching stop layer 142 and the patterned semiconductor layer 131, and a thin film transistor 500T is accordingly formed on the substrate 101. Then, as shown in FIG. 21, after the third patterned photoresist 569 is removed, or after the third photolithography process, a fourth photolithography process can be carried out to form an isolation layer 190 on the source electrode 161 and the drain electrode 162, and the isolation layer 190 preferably has a pixel opening 190V to at least partially expose the pixel electrode 171. An array substrate 500 as shown in FIG. 21 can be formed through the above-mentioned steps. Except that there is no hard mask layer formed in this embodiment, the disposition of the workpiece and the material characteristic of the array substrate 500 in this embodiment are similar to the array substrate 100 of the first preferred embodiment and will not be redundantly described. In addition, in other preferred embodiments of this disclosure, a protective layer can be selectively formed between the isolation layer 190 and the thin film transistor 500T to enhance the protection effect if necessary.

Figure 22:
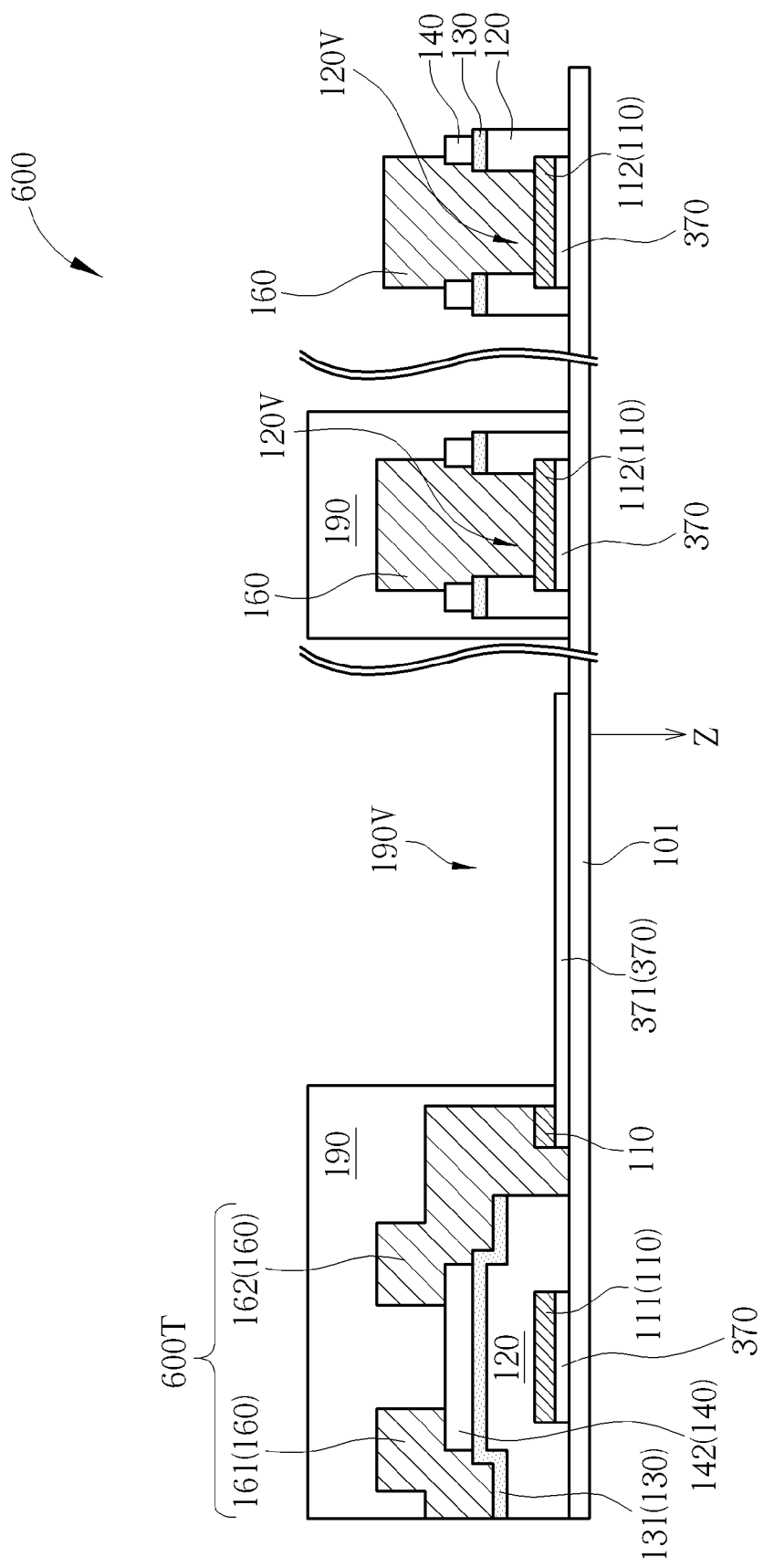
FIG. 22 is a schematic diagram illustrating a manufacturing method of an array substrate according to a sixth preferred embodiment.

Please refer to FIG. 22 and also refer to FIGS. 10-13. FIG. 22 is a schematic diagram illustrating a manufacturing method of an array substrate according to a sixth preferred embodiment. As shown in FIG. 22, except that there is no hard mask layer formed in this embodiment, the disposition of the workpiece and the material characteristic of the array substrate 600 and its thin film transistor 600T in this embodiment are similar to the array substrate 300 and the thin film transistor 330T of the third preferred embodiment and will not be redundantly described. It is worth noting that there is no hard mask layer formed in the second photolithography process of this embodiment, so the detailed steps of the second photolithography process in this embodiment is similar to the detailed steps of the second photolithography process in the above-mentioned fifth preferred embodiment. In addition, in other preferred embodiments of this disclosure, a protective layer can be selectively formed between the isolation layer 190 and the thin film transistor 600T to enhance the protection effect if necessary.

Figure 23:
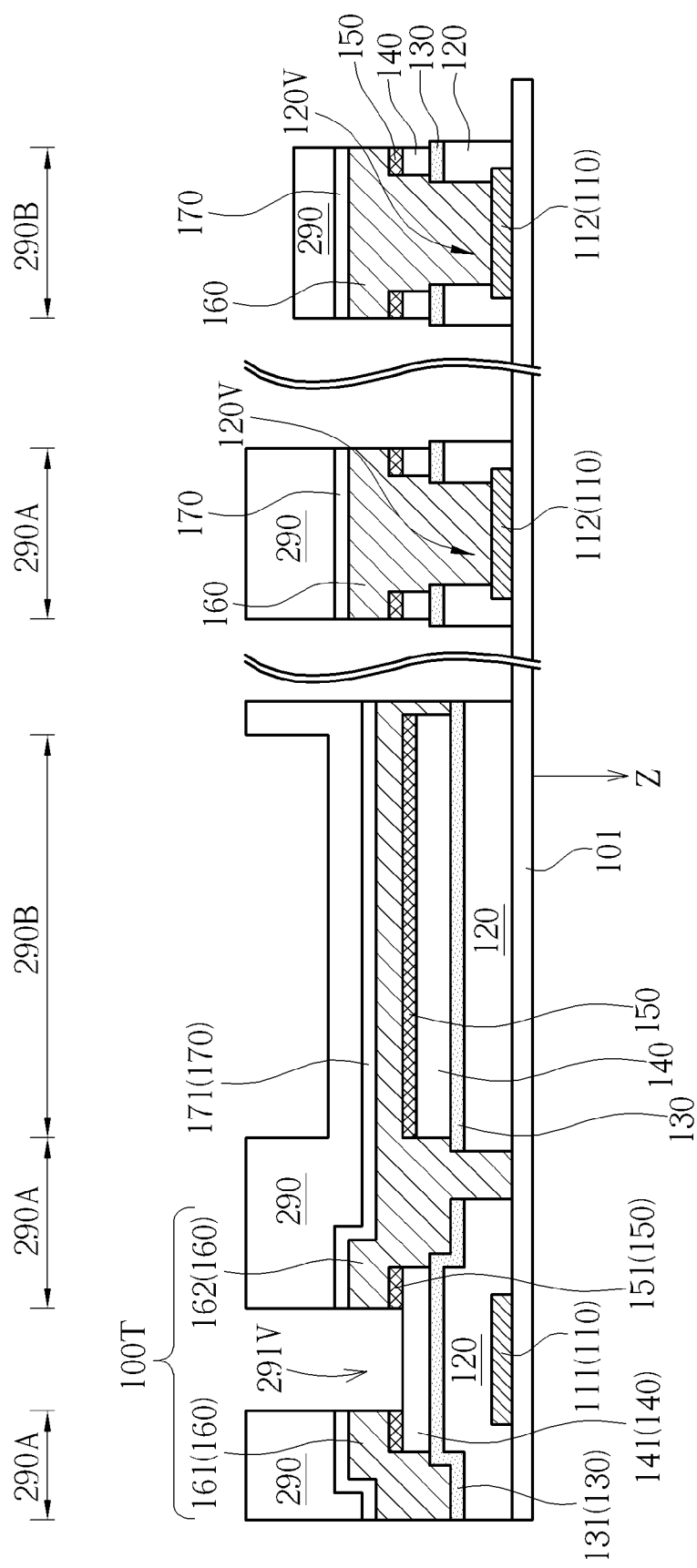
FIG. 23 and FIG. 24 are schematic diagrams illustrating a manufacturing method of an array substrate according to a seventh preferred embodiment.
Figure 24:
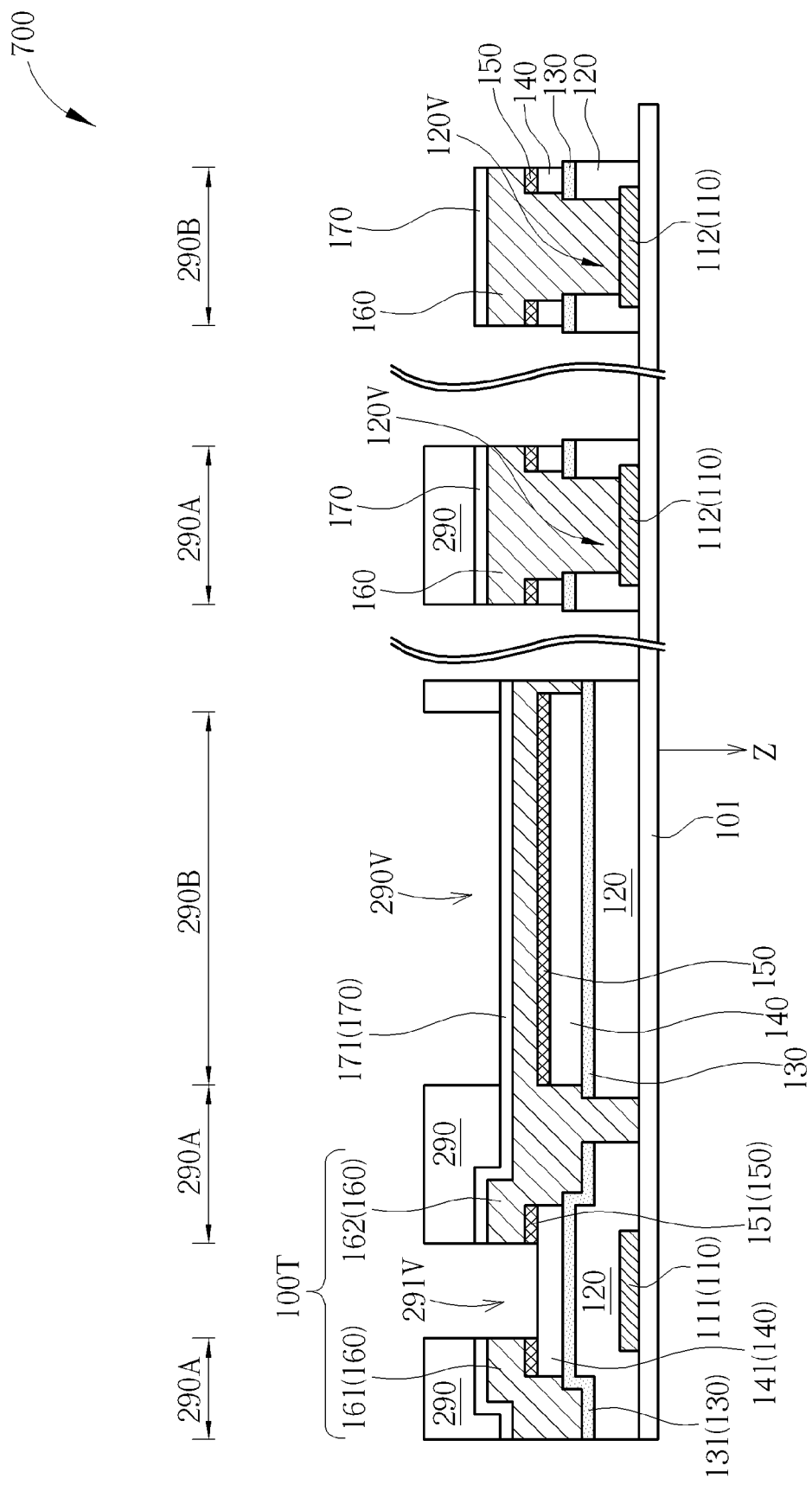

Please refer to FIG. 23 and FIG. 24, and also refer to FIG. 1 and FIG. 2. FIG. 23 and FIG. 24 are schematic diagrams illustrating a manufacturing method of an array substrate according to a seventh preferred embodiment. The first photolithography process and the second photolithography process in the manufacturing method of an array substrate according to this embodiment are similar to those of the above-mentioned first preferred embodiment (as shown in FIG. 1 and FIG. 2) and will not be redundantly described. As shown in FIG. 23, the manufacturing method of an array substrate according to this embodiment comprises performing a third photolithography process after the second photolithography process to form a source electrode 161, a drain electrode 162 and a pixel electrode 171 on the patterned etching stop layer 141 and the patterned semiconductor layer 131. In further description, the third photolithography process in this embodiment may comprise the following steps. First, a second conductive layer 160 is formed to cover the patterned hard mask layer 151 and the patterned semiconductor layer 131. Then, a transparent conductive layer 170 is formed on the second conductive layer 160 and an isolation layer 290 is formed on the transparent conductive layer 170. Then, the transparent conductive layer 170 and the second conductive layer 160 uncovered by the isolation layer 290 can be removed through an etching process for forming the pixel electrode 171, the source electrode 161 and the drain electrode 162, and a thin film transistor 100T is accordingly formed on the substrate 101. In addition, the isolation layer 290 of this embodiment preferably has an opening 291V, and at least a part of the patterned hard mask layer 151 uncovered by the isolation layer 290 and the second conductive layer 160 can be removed through the opening 291V when forming the source electrode 161 and the drain electrode 162, so as to prevent the source electrode 161 and the drain electrode 162 from being electrically connected to each other directly. It is worth noting that the isolation layer 290 in this embodiment preferably has a first thickness region 290A and a second thickness region 290B, and a thickness of the isolation layer 290 in the second thickness region 290B is thinner than a thickness of the isolation layer 290 in the first thickness region 290A. The isolation layer 290 in this embodiment preferably comprises photo patternable materials, such as photo patternable organic material, but not limited thereto. In other words, the isolation layer 290 can be formed through a photolithography process, but not limited thereto. In addition, the thickness difference between the isolation layer 290 in the first thickness region 290A and the isolation layer 290 in the second thickness region 290B may be obtained by an exposure process with a multi-tone photomask (not shown), and the multi-tone photomask may have at least three different transmitting ratio regions, but the present disclosure is not limited to this. In other preferred embodiments of the present disclosure, other appropriate approaches may also be used to obtain the thickness difference between the isolation layer 290 in the first thickness region 290A and the isolation layer 290 in the second thickness region 290B.

Then, as shown in FIG. 24, the manufacturing method of an array substrate in this embodiment further comprises removing the isolation layer 290 in the second thickness region 290B and forming a pixel opening 290V which partially exposes the pixel electrode 171, through a process such as an ashing process. Then an array substrate 700 can be formed by the above-mentioned steps. It is worth noting that the second thickness region 290B in this embodiment is preferably disposed correspondingly to the pixel electrode 171 and at least a portion of the pad electrode 112 in order to have a portion of the second conductive layer 160 and the transparent layer 170 on the pad electrode 112 protected by the isolation layer 290 in the second thickness region 290B during the steps of forming the pixel electrode 171, the source electrode 161 and the drain electrode 162. The isolation layer 290 in the second thickness region 290B is removed to partially expose the second conductive layer 160 and the transparent conductive layer 170 corresponding to the pad electrode 112, and an outside circuit or an outside device (not shown) can be electrically connected to the array substrate 700 by the pad electrode 112 uncovered by the isolation layer 290. In this embodiment, a process-simplified manufacturing method can be achieved by using the isolation layer 290 in the third photolithography process as a mask to define the pixel electrode 171, the source electrode 161 and the drain electrode 162. The difference between the array substrate 700 in this embodiment and the array substrate 100 in the first preferred embodiment is that there is an opening 291V in the isolation layer 290 in this embodiment, and the opening 291V at least partially exposes the thin film transistor 100T. Apart from the isolation layer 290, the disposition of the workpiece and the material characteristic of the array substrate 700 in this embodiment are similar to those of the array substrate 100 in the first preferred embodiment and will not be redundantly described.

Figure 25:
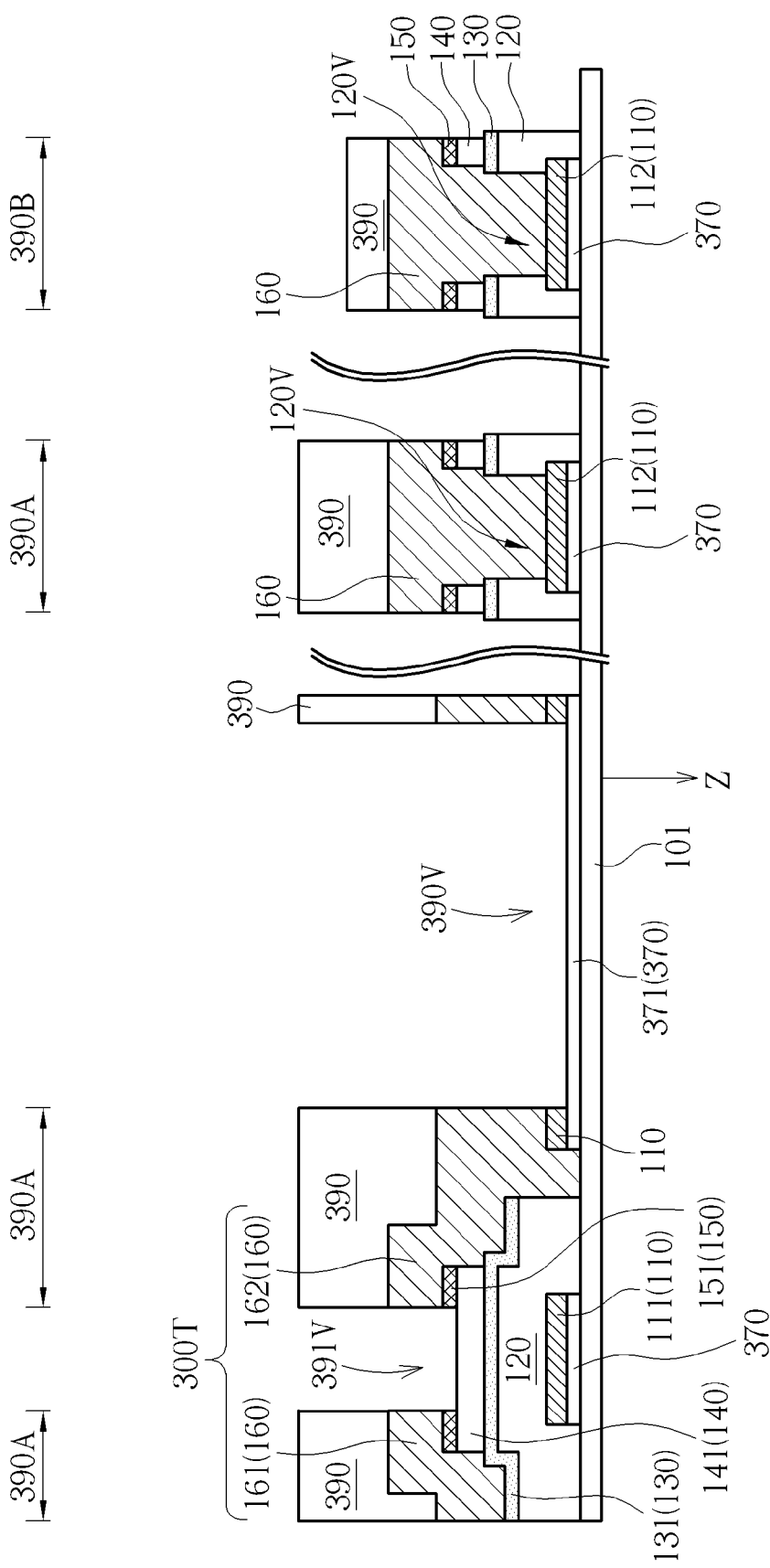
FIG. 25 and FIG. 26 are schematic diagrams illustrating a manufacturing method of an array substrate according to an eighth preferred embodiment.
Figure 26:
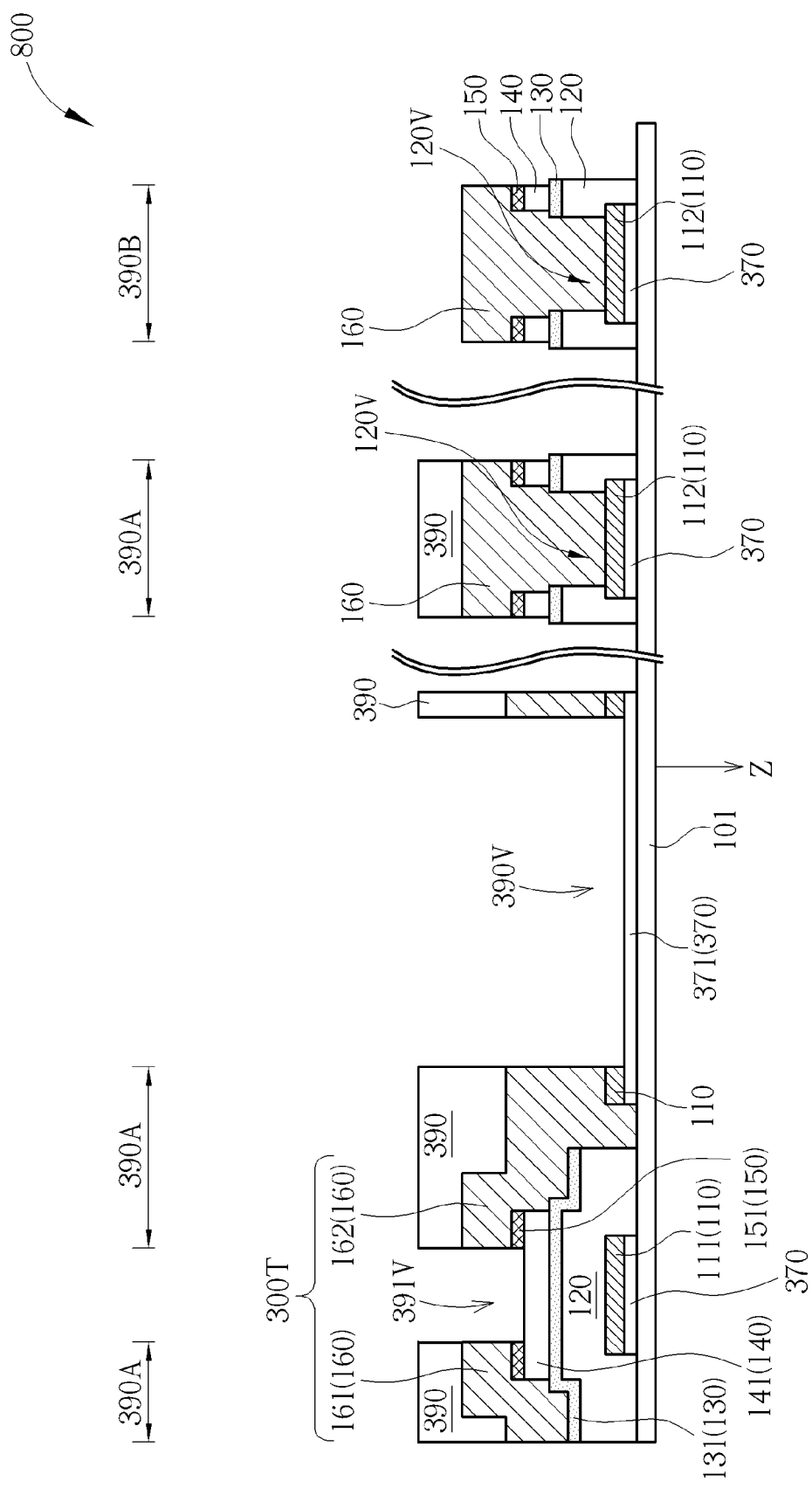

Please refer to FIG. 25 and FIG. 26, and also refer to FIG. 10 and FIG. 11. FIG. 25 and FIG. 26 are schematic diagrams illustrating a manufacturing method of an array substrate according to an eighth preferred embodiment. The first photolithography process and the second photolithography process in the manufacturing method of an array substrate according to this embodiment are similar to those of the above-mentioned third preferred embodiment (as shown in FIG. 10 and FIG. 11) and will not be redundantly described. As shown in FIG. 25, the manufacturing method of an array substrate according to a this embodiment comprises performing a third photolithography process after the second photolithography process to form a source electrode 161 and a drain electrode 162 on the patterned etching stop layer 141 and the patterned semiconductor layer 131. In further description, the third photolithography process in this embodiment may comprise the following steps. First, a second conductive layer 160 is formed to cover the patterned hard mask layer 151, the patterned semiconductor layer 131 and a portion of the first conductive layer 110. Then, an isolation layer 390 can be formed on the second conductive layer 160. Then, the second conductive layer 160 uncovered by the isolation layer 390 can be removed through an etching process for forming the source electrode 161 and the drain electrode 162, and a thin film transistor 300T is accordingly formed on the substrate 101. It is worth noting that when the second conductive layer 160 uncovered by the isolation layer 390 is removed in the third photolithography process of this embodiment, at least a part of the first conductive layer 110 uncovered by the isolation layer 390 can be removed to at least partially expose the pixel electrode 371 at the same time. More precisely, in the third photolithography process of this embodiment, the first conductive layer 110 on the pixel electrode 371 is etched simultaneously in the step of etching the second conductive layer 160 so as to at least partially expose the pixel electrode 371. In addition, the isolation layer 390 in this embodiment preferably has an opening 391V, and by employing the opening 391V, at least a part of the patterned hard mask layer 151 uncovered by the isolation layer 390 and the second conductive layer 160 can be removed when forming the source electrode 161 and the drain electrode 162, so as to prevent the source electrode 161 and the drain electrode 162 from being electrically connected to each other directly.

Moreover, the isolation layer 390 in this embodiment preferably has a first thickness region 390A and a second thickness region 390B, and a thickness of the isolation layer 390 in the second thickness region 390B is thinner than a thickness of the isolation layer 390 in the first thickness region 390A. As shown in FIG. 25, the manufacturing method of an array substrate in this embodiment further comprises performing a process, such as an ashing process, to remove the isolation layer 390 in the second thickness region 390B, so as to expose the second conductive layer 160 corresponding to the pad electrode 112 in the second thickness region 390B. An array substrate 800 can be formed by the above-mentioned steps. It is worth noting that the difference between the array substrate 800 in this embodiment and the array substrate 300 in the third preferred embodiment is that there are a pixel opening 390V and an opening 391V in the isolation layer 390 in this embodiment, and the pixel opening 390V at least partially exposes the pixel electrode 371 and the opening 391V at least partially exposes the thin film transistor 300T. Apart from the isolation layer 390, the disposition of the workpiece and the material characteristic of the array substrate 800 in this embodiment are similar to those of the array substrate 300 in the third preferred embodiment and will not be redundantly described.

To summarize the above descriptions, in the present disclosure, the steps of manufacturing processes of the semiconductor layer and the etching stop layer are adjusted, and an isolation layer is used to define the source electrode and the drain electrode so as to further simplify the manufacturing process and reduce the number of photomasks used. The line width controlling and the uniformity of the patterned etching stop layer can be improved by using the patterned hard mask layer to define the patterned etching stop layer. And the electrical property of the corresponding thin film transistor and the uniformity of the electrical property in each region on the array substrate can be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An array substrate, comprising:
    a substrate;
    a thin film transistor, disposed on the substrate, wherein the thin film transistor comprises:
        a gate electrode;
        a gate insulating layer, disposed on the gate electrode;
        a patterned semiconductor layer, disposed on the gate insulating layer;
        a patterned etching stop layer, disposed on the patterned semiconductor layer;
        a source electrode and a drain electrode, disposed on the patterned etching stop layer and the patterned semiconductor layer; and
        a patterned hard mask layer, disposed between the source electrode and the patterned etching stop layer and disposed between the drain electrode and the patterned etching stop layer; and
    a pixel electrode, disposed on the substrate, and the pixel electrode is electrically connected to the thin film transistor.

2. The array substrate of claim 1, further comprising an isolation layer disposed on the substrate, the isolation layer at least partially covering the thin film transistor, wherein the isolation layer has a pixel opening and the pixel opening at least partially exposes the pixel electrode.

3. The array substrate of claim 2, wherein the isolation layer further comprises an opening, and the opening at least partially expose the thin film transistor.

4. The array substrate of claim 2, further comprising a protective layer disposed between the isolation layer and the thin film transistor.

5. The array substrate of claim 1, wherein the pixel electrode is disposed on the drain electrode, and the pixel electrode at least partially overlaps the patterned semiconductor layer along a direction perpendicular to the substrate.

6. The array substrate of claim 1, wherein the pixel electrode is at least partially disposed between the drain electrode and the substrate.

7. The array substrate of claim 1, wherein the patterned semiconductor layer comprises an oxide semiconductor material, an amorphous silicon semiconductor material, or a poly silicon semiconductor material.

8. The array substrate of claim 1, wherein the patterned hard mask layer comprises a metallic material.

9. The array substrate of claim 8, wherein the metallic material comprises a material containing at least one of aluminum (Al), copper (Cu), silver (Ag), chromium (Cr), titanium (Ti), and molybdenum (Mo), a stack layer of the above-mentioned materials, or an alloy of the above-mentioned materials.

* * * * *